(12) United States Patent
Aritome

(10) Patent No.: US 7,795,664 B2
(45) Date of Patent: Sep. 14, 2010

(54) FINNED MEMORY CELLS

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/257,100

(22) Filed: Oct. 23, 2008

(65) Prior Publication Data

US 2009/0045449 A1 Feb. 19, 2009

Related U.S. Application Data

(62) Division of application No. 11/514,004, filed on Aug. 31, 2006, now Pat. No. 7,452,766.

(51) Int. Cl.
*H01L 29/76* (2006.01)
*H01L 21/8238* (2006.01)

(52) U.S. Cl. ............... 257/314; 257/315; 257/E21.014; 257/E27.091; 257/E27.096; 438/211; 438/257

(58) Field of Classification Search ................. 438/257, 438/211, 265; 257/314–318, E21.681, E21.703, 257/E21.209, E21.017
See application file for complete search history.

(56) References Cited

U.S. PATENT DOCUMENTS

| 7,026,195 | B2 | 4/2006 | Cheng et al. | |
|---|---|---|---|---|
| 7,297,600 | B2 | 11/2007 | Oh et al. | |
| 7,473,611 | B2 * | 1/2009 | Cho et al. | 438/381 |
| 2006/0141706 | A1 | 6/2006 | Hong | |
| 2007/0090443 | A1 * | 4/2007 | Choi et al. | 257/314 |
| 2008/0009115 | A1 * | 1/2008 | Willer et al. | 438/257 |

* cited by examiner

*Primary Examiner*—Hsien-ming Lee
(74) *Attorney, Agent, or Firm*—Leffert Jay & Polglaze, P.A.

(57) ABSTRACT

For an embodiment, a memory array has a plurality fins protruding from a substrate. A tunnel dielectric layer overlies the fins. A plurality floating gates overlie the tunnel dielectric layer, and the floating gates correspond one-to-one with the fins protruding from the substrate. An intergate dielectric layer overlies the floating gates. A control gate layer overlies the intergate dielectric layer. Each fin includes an upper surface rounded by isotropic etching.

22 Claims, 28 Drawing Sheets

FINNED MEMORY CELLS

RELATED APPLICATION

This Application is a divisional of U.S. application Ser. No. 11/514,004, titled, "FINNED MEMORY CELLS AND THE FABRICATION THEREOF," filed Aug. 31, 2006, now U.S. Pat. No. 7,452,766 (allowed), which is commonly assigned and incorporated in its entirety herein by reference.

TECHNICAL FIELD

The present disclosure relates generally to memory devices and in particular the present invention relates to finned memory cells and the fabrication thereof.

BACKGROUND

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

NOR and NAND flash memory devices are two common types of flash memory devices, so called for the logical form of the basic memory cell configuration in which each is arranged. Typically, for NOR flash memory devices, the control gate of each memory cell of a row of the array is connected to a word line, and the drain region of each memory cell of a column of the array is connected to a bit line. The memory array for NOR flash memory devices is accessed by a row decoder activating a row of floating-gate memory cells by selecting the word line coupled to their gates. The row of selected memory cells then place their data values on the column bit lines by flowing a differing current, depending upon their programmed states, from a coupled source line to the coupled column bit lines.

The array of memory cells for NAND flash memory devices is also arranged such that the control gate of each memory cell of a row of the array is connected to a word line. However, each memory cell is not directly coupled to a column bit line by its drain region. Instead, the memory cells of the array are arranged together in strings (often termed NAND strings), typically of 32 each, with the memory cells coupled together in series, source to drain, between a source line and a column bit line. The memory array for NAND flash memory devices is then accessed by a row decoder activating a row of memory cells by selecting the word line coupled to a control gate of a memory cell. In addition, the word lines coupled to the control gates of unselected memory cells of each string are driven to operate the unselected memory cells of each string as pass transistors, so that they pass current in a manner that is unrestricted by their stored data values. Current then flows from the source line to the column bit line through each series coupled string, restricted only by the selected memory cells of each string. This places the current-encoded data values of the row of selected memory cells on the column bit lines.

However, as the density of memory cells increases, there is typically a corresponding decrease in the channel widths of the memory cells that leads to small cell currents, which in turn increase program verify times and thus programming times. Moreover, smaller cell structures are typically difficult to fabricate. FinFet devices, having a channel formed on an elongated protrusion (or a fin) formed in a substrate, increase cell currents and have improved cut-off characteristics compared to conventional memory cells, but generally have poorer coupling ratios than conventional memory cells.

For the reasons stated above, and for other reasons stated below which will become apparent to those skilled in the art upon reading and understanding the present specification, there is a need in the art for alternative finned memory devices.

DETAILED DESCRIPTION

In the following detailed description of the present embodiments, reference is made to the accompanying drawings that form a part hereof, and in which are shown by way of illustration specific embodiments that may be practiced. These embodiments are described in sufficient detail to enable those skilled in the art to practice disclosed subject matter, and it is to be understood that other embodiments may be utilized and that process, electrical or mechanical changes may be made without departing from the scope of the claimed subject matter. The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the claimed subject matter is defined only by the appended claims and equivalents thereof.

Figure 1:
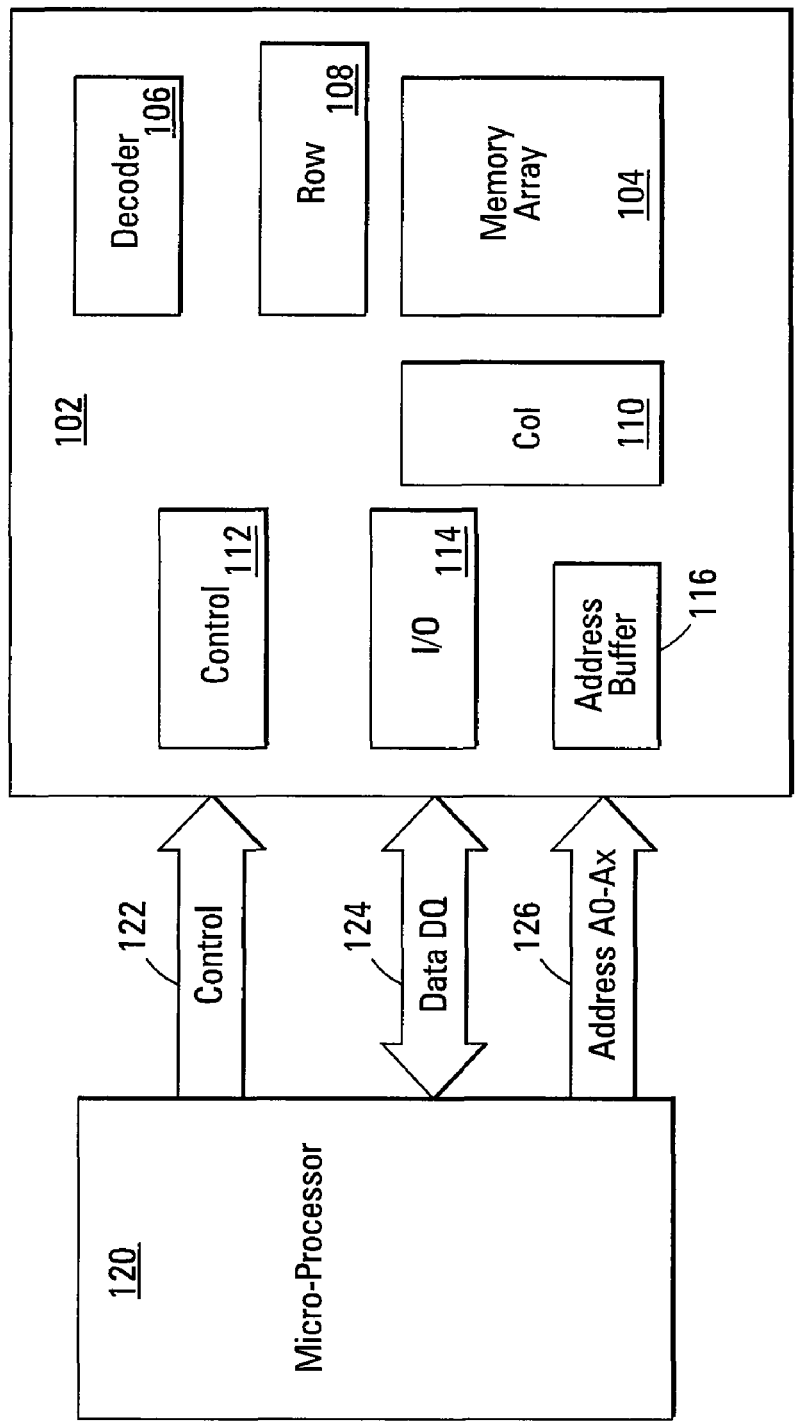
FIG. 1 is a block diagram illustration of an integrated circuit device, according to an embodiment of the disclosure.

FIG. 1 is a block diagram illustration of an integrated circuit device, such as a processor, a memory device 102, etc., according to an embodiment. The memory device 102 may be fabricated as semiconductor device on a semiconductor substrate. Examples of memory devices include NAND, NOR, or NROM flash memory devices, dynamic random access memory devices (DRAMs), static random access memory devices (SRAMs), or the like.

For one embodiment, memory device 102 includes an array of flash memory cells 104, an address decoder 106, row access circuitry 108, column access circuitry 110, control circuitry 112 coupled to memory array 104 for controlling operations of memory array 104, Input/Output (I/O) circuitry 114, and an address buffer 116. Memory device 102 may be coupled an external microprocessor 120, or memory controller, for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

The memory array 104 includes memory cells arranged in row and column fashion. For one embodiment, each of the memory cells includes a floating-gate field-effect transistor capable of holding a charge. The cells may be grouped into blocks. Each of the cells within a block can be electrically programmed on an individual basis by charging the floating gate. The charge can be removed from the floating gate by a block erase operation. Memory array 104 is in accordance with embodiments of the disclosure.

Figure 2:
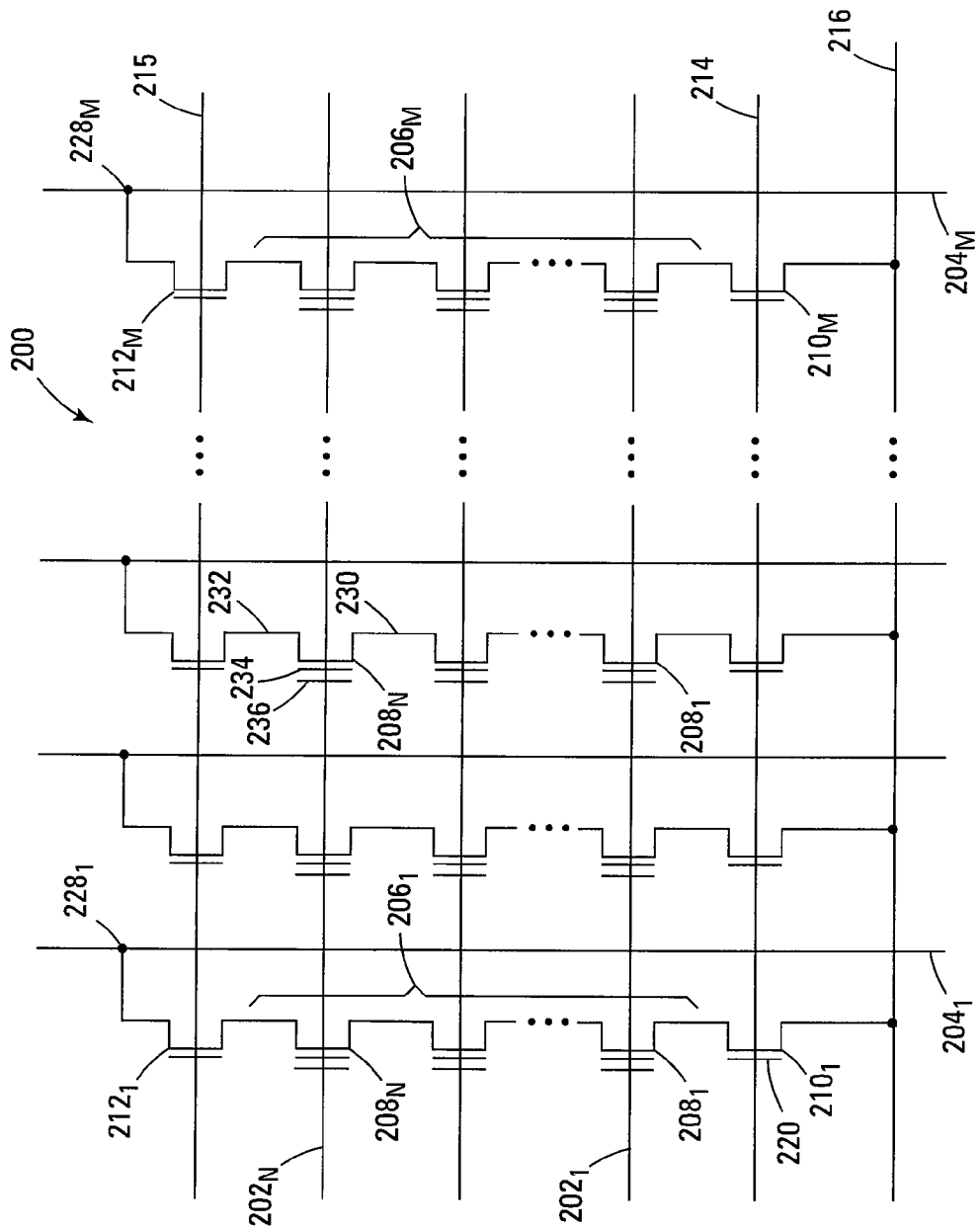
FIG. 2 is a schematic of a NAND memory array in accordance with another embodiment of the disclosure.

FIG. 2 is a schematic of a NAND memory array 200 as a portion of memory array 104 in accordance with another embodiment. As shown in FIG. 2, the memory array 200 includes word lines $202_1$ to $202_N$ and intersecting bit lines $204_1$ to $204_M$. For ease of addressing in the digital environment, the number of word lines 202 and the number of bit lines 204 are each some power of two, e.g., 256 word lines 202 by 4,096 bit lines 204. For one embodiment, bit lines 204 are coupled to column access circuitry 110 and word lines 202 are coupled to row access circuitry 108.

Memory array 200 includes NAND strings $206_1$ to $206_M$. Each NAND string includes floating-gate transistors $208_1$ to $208_N$, each located at an intersection of a word line 202 and a bit line 204. The floating-gate transistors 208 represent non-volatile memory cells for storage of data. The floating-gate transistors 208 of each NAND string 206 are connected in series, source to drain, between a source select line 214 and a drain select line 215. Source select line 214 includes a source select gate 210, e.g., a field-effect transistor (FET), at each intersection between a NAND string 206 and source select line 214, and drain select line 215 includes a drain select gate 212, e.g., a field-effect transistor (FET), at each intersection between a NAND string 206 and drain select line 215. In this way, the floating-gate transistors 208 of each NAND string 206 are connected between a source select gate 210 and a drain select gate 212.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. Each source select gate 210 includes a control gate 220.

The drain of each drain select gate 212 is connected to the bit line 204 for the corresponding NAND string at a drain contact 228. For example, the drain of drain select gate $212_1$ is connected to the bit line $204_1$ for the corresponding NAND string $206_1$, at drain contact $228_1$. The source of each drain select gate 212 is connected to the drain of the last floating-gate transistor $208_N$ of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of memory array 200 includes a NAND string 206 and the source and drain select gates connected thereto. A row of the floating-gate transistors 208 are those transistors commonly coupled to a given word line 202. Memory array 200 is in accordance with embodiments of the disclosure.

Embodiments of the disclosure are applicable to other architectures of flash memory devices besides the NAND flash architecture of FIG. 2 that are known to those of skill in the art, such as, but not limited to NOR, AND, NROM flash memory devices, etc.

Figure 3:
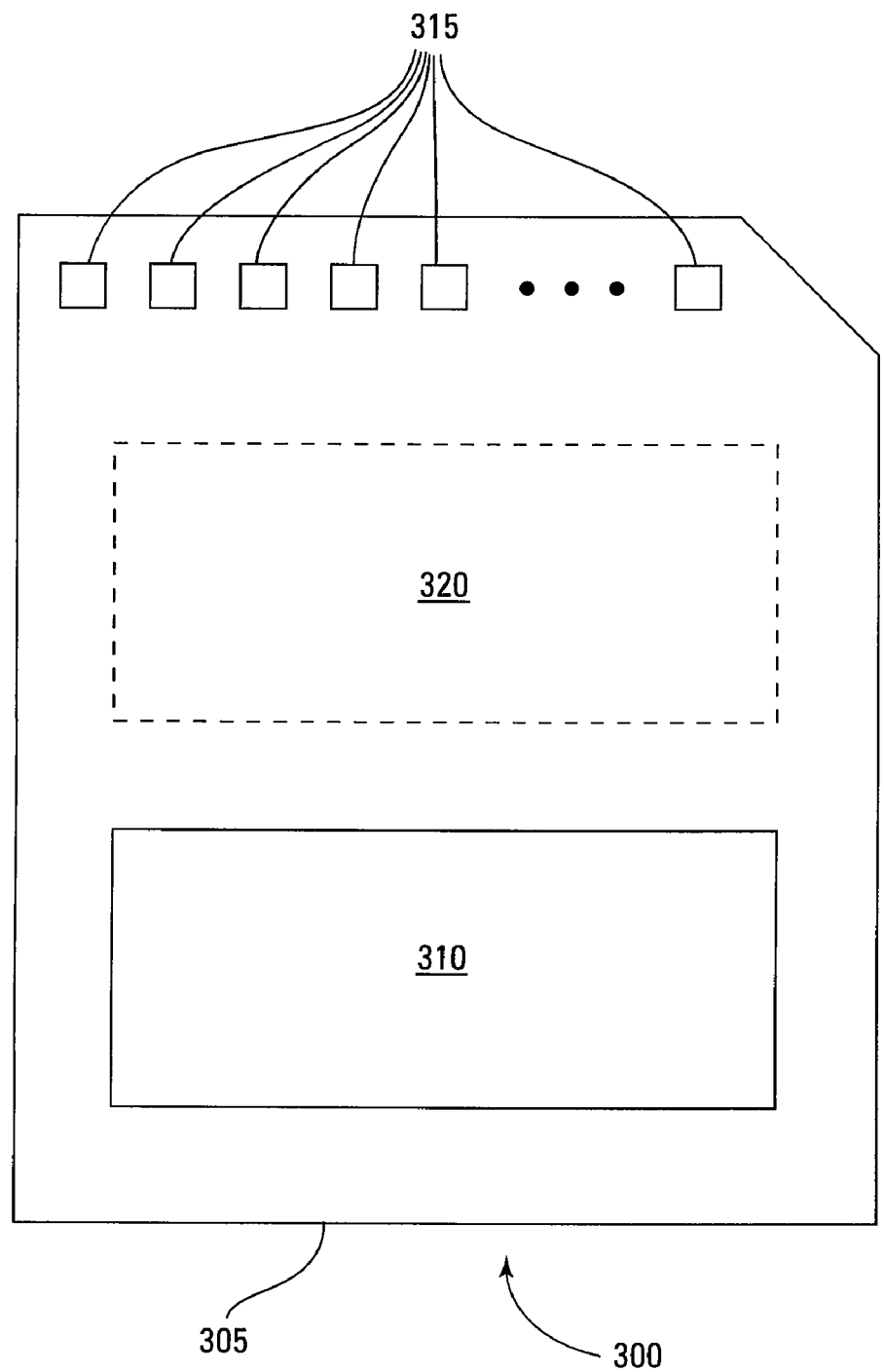
FIG. 3 is an illustration of an exemplary memory module, according to another embodiment of the disclosure.

FIG. 3 is an illustration of an exemplary memory module 300, according to another embodiment. Memory module 300 is illustrated as a memory card, although the concepts discussed with reference to memory module 300 are applicable to other types of removable or portable memory, e.g., USB flash drives, and are intended to be within the scope of "memory module" as used herein. In addition, although one example form factor is depicted in FIG. 3, these concepts are applicable to other form factors as well.

In some embodiments, memory module 300 will include a housing 305 (as depicted) to enclose one or more memory devices 310, though such a housing is not essential to all devices or device applications. At least one memory device 410 may be a NAND, NOR, AND, or NROM flash memory device, dynamic random access memory device (DRAM), static random access memory device (SRAM), or the like having a memory array in accordance with the disclosure. Where present, the housing 305 includes one or more contacts 315 for communication with a host device. Examples of host devices include digital cameras, digital recording and playback devices, PDAs, personal computers, memory card readers, interface hubs and the like. For some embodiments, the contacts 315 are in the form of a standardized interface. For example, with a USB flash drive, the contacts 315 might be in the form of a USB Type-A male connector. For some embodiments, the contacts 315 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 315 provide an interface for passing control, address, and/or data signals between the memory module 300 and a host having compatible receptors for the contacts 315.

The memory module 300 may optionally include additional circuitry 320 which may be one or more integrated circuits and/or discrete components. For some embodiments, the additional circuitry 320 may include a memory controller for controlling access across multiple memory devices 310 and/or for providing a translation layer between an external host and a memory device 310. For example, there may not be a one-to-one correspondence between the number of contacts 315 and a number of I/O connections to the one or more memory devices 310. Thus, a memory controller could selectively couple an I/O connection (not shown in FIG. 3) of a memory device 310 to receive the appropriate signal at the appropriate I/O connection at the appropriate time or to provide the appropriate signal at the appropriate contact 315 at the appropriate time. Similarly, the communication protocol between a host and the memory module 300 may be different than what is required for access of a memory device 310. A memory controller could then translate the command sequences received from a host into the appropriate command sequences to achieve the desired access to the memory device 310. Such translation may further include changes in signal voltage levels in addition to command sequences.

The additional circuitry 320 may further include functionality unrelated to control of a memory device 310 such as logic functions as might be performed by an ASIC (application specific integrated circuit). Also, the additional circuitry 320 may include circuitry to restrict read or write access to the memory module 300, such as password protection, biometrics or the like. The additional circuitry 320 may include circuitry to indicate a status of the memory module 300. For example, the additional circuitry 320 may include functionality to determine whether power is being supplied to the memory module 300 and whether the memory module 300 is currently being accessed, and to display an indication of its status, such as a solid light while powered and a flashing light while being accessed. The additional circuitry 320 may further include passive devices, such as decoupling capacitors to help regulate power requirements within the memory module 300.

Figure 4A:
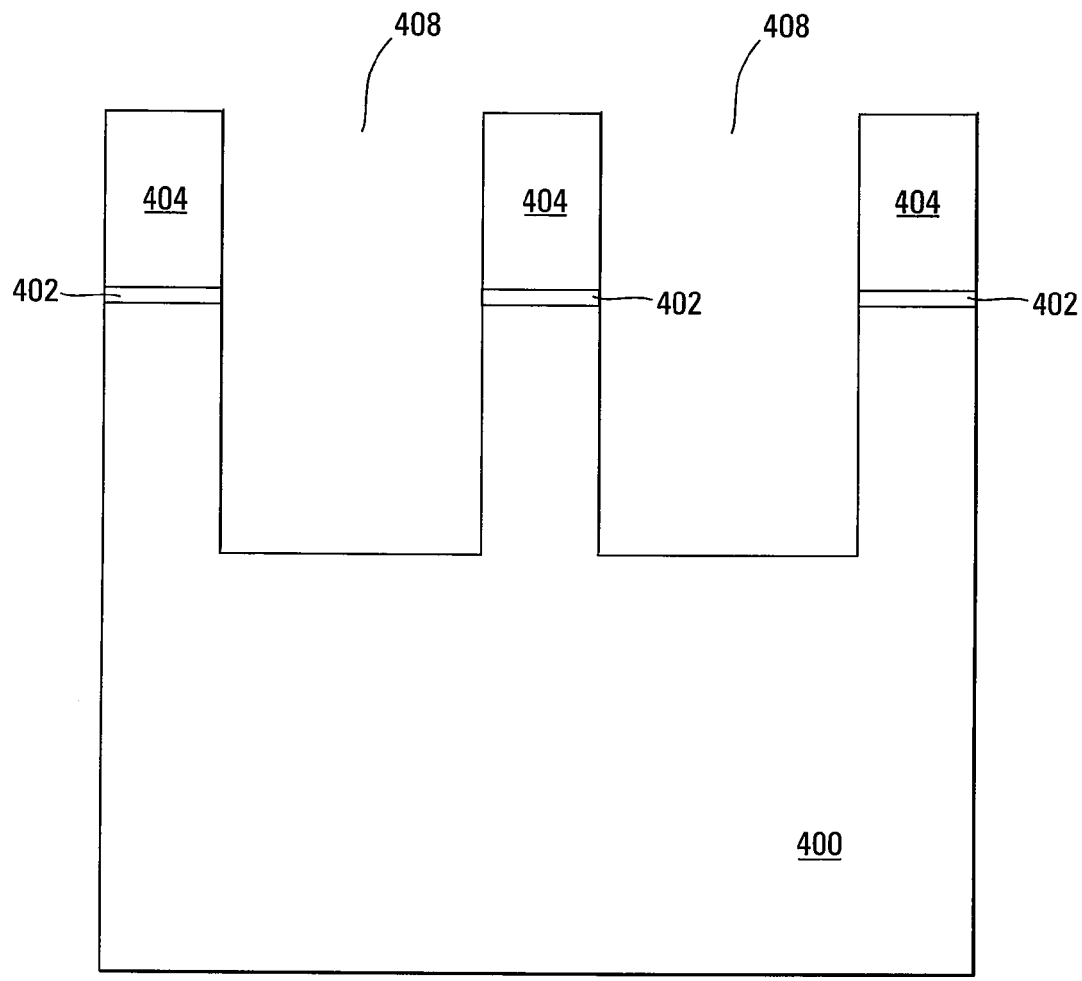
FIGS. 4A-4J are cross-sectional views of a portion of a row of a memory array during various stages of fabrication, according to another embodiment of the disclosure.

FIGS. 4A-4J are cross-sectional views of a portion of a row of a memory array, such as a portion of a row memory array 200 of FIG. 2 or a portion of a row of memory array 104 of FIG. 1, during various stages of fabrication, according to an embodiment. FIG. 4A depicts the portion of the memory array after several processing steps have occurred.

Formation of the structure depicted in FIG. 4A is well known and will not be detailed herein. In general, for one embodiment, the structure of FIG. 4A is formed by forming a sacrificial layer 402, e.g., of dielectric material, such as a pad-oxide (e.g., silicon dioxide) on a semiconductor substrate 400 that is of monocrystalline silicon or the like. A hard mask (or cap) layer 404, e.g., of silicon nitride, is formed on sacrificial layer 402. Trenches 408 may be formed by patterning hard mask layer 404 and removing portions of hard mask layer 404, sacrificial layer 402, and substrate 400 exposed by patterned hard mask layer 404.

Figure 4B:
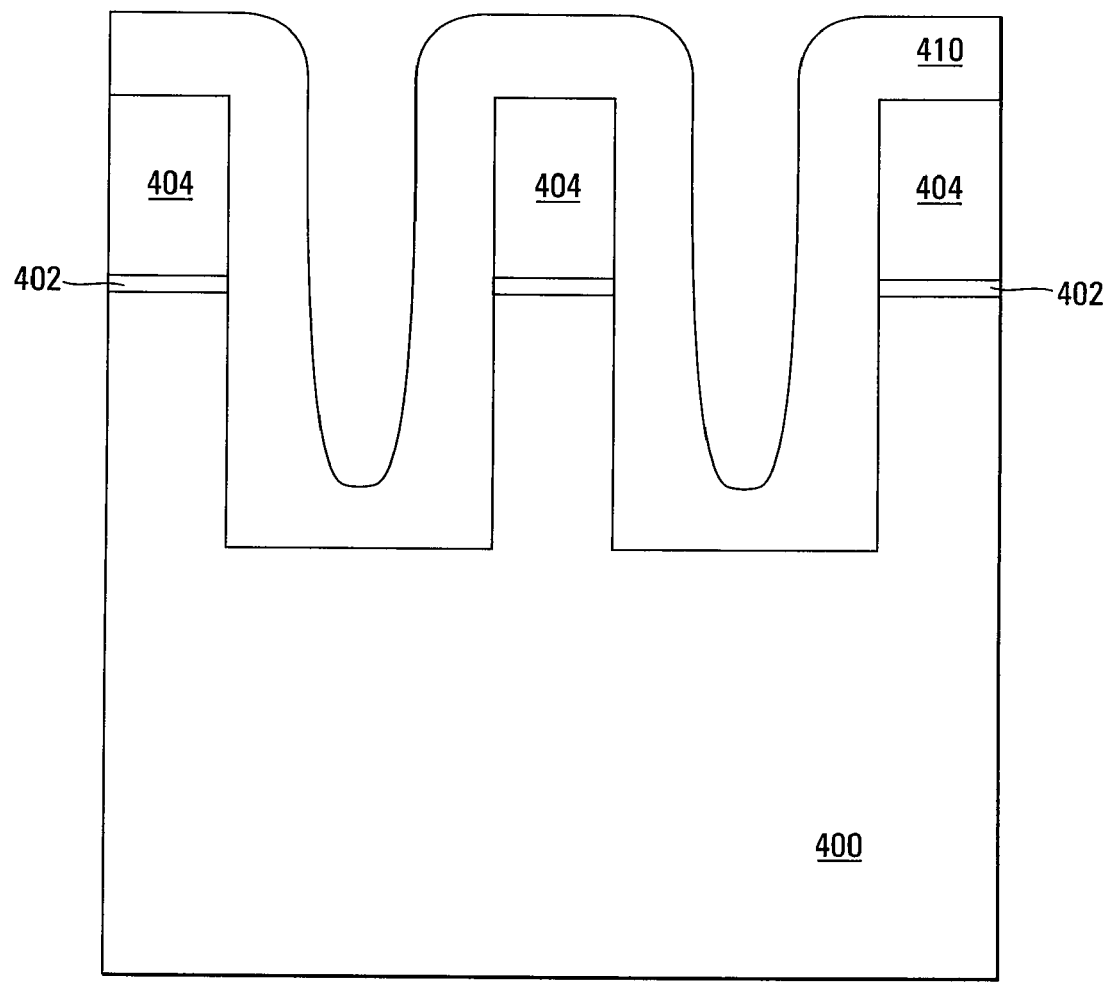
Figure 4C:
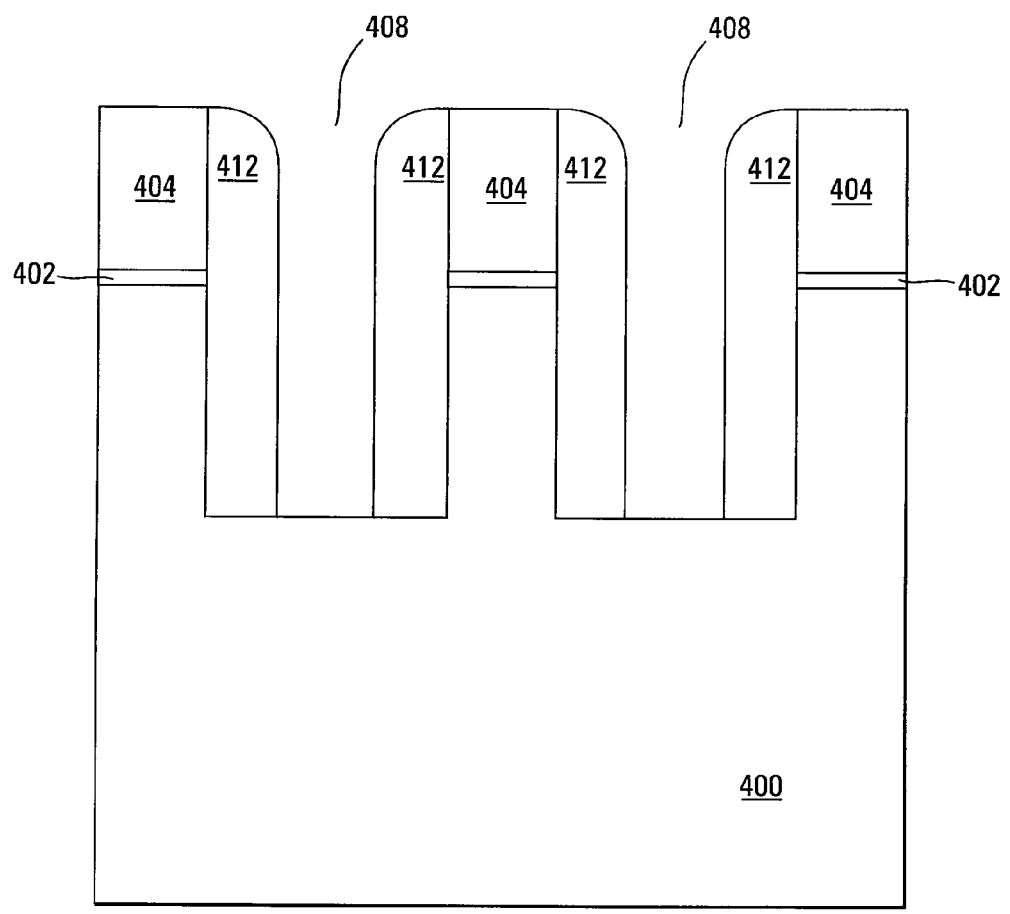

A dielectric layer 410, e.g., of silicon nitride, is formed overlying the structure of FIG. 4A in FIG. 4B, e.g., using a blanket deposition. Portions of dielectric layer 410 are then anisotropically removed, e.g., using a chemical wet etch or a plasma dry etch, so that remaining portions of dielectric layer 410 self align with and form spacers 412 on sidewalls of trenches 408 in FIG. 4C. For one embodiment, this is accomplished using an anisotropic etching process that selectively removes horizontal portions of dielectric layer 410. Spacers 412 and remaining portions of hard mask layer 404 form a pattern for respectively exposing portions of substrate 400 for removal. The exposed portions of substrate 400 are removed in FIG. 4D so as to extend trenches 408 further into substrate 400.

Figure 4D:
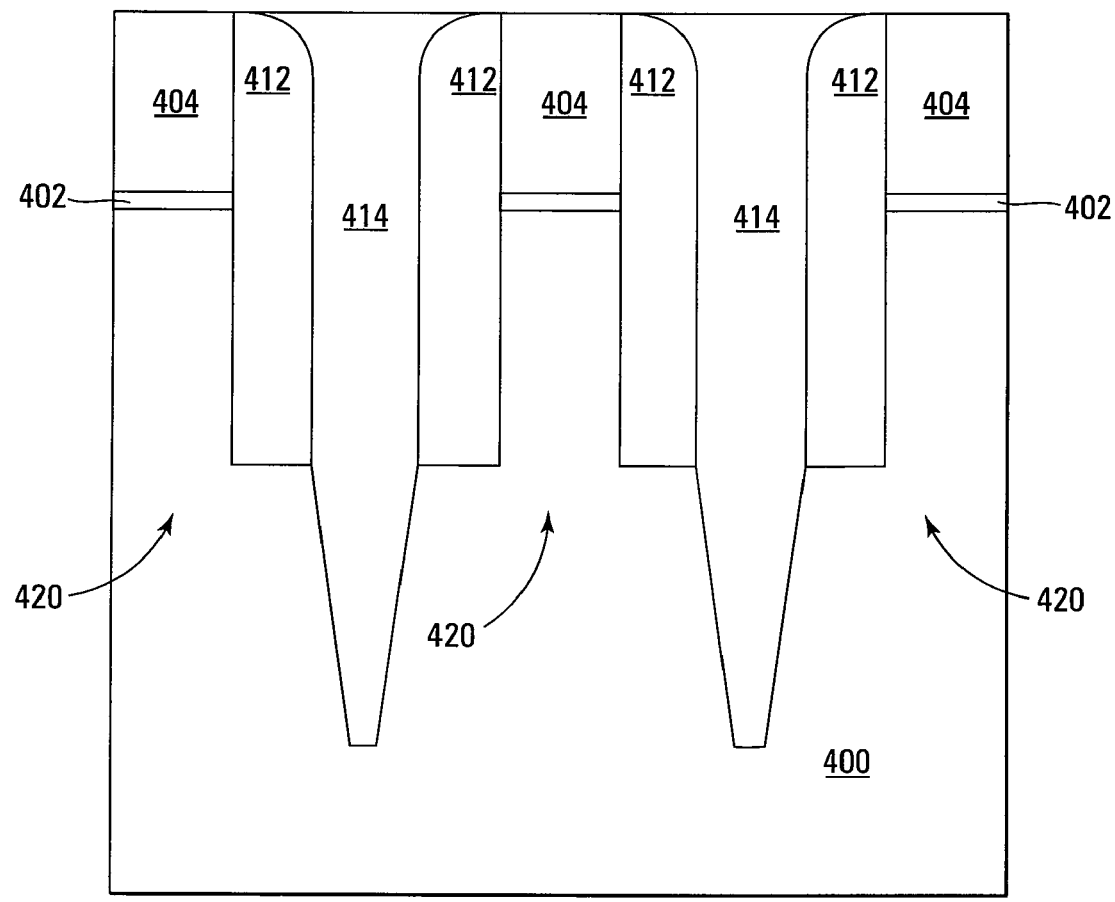

Isolation regions 414, such as shallow trench isolation (STI) regions, are then formed in FIG. 4D by filling the trenches with a suitable dielectric material, such as an oxide, e.g., a thermal oxide and/or a high-density-plasma (HDP) oxide, a spin-on dielectric material, e.g., hydrogen silsesquioxane (HSQ), hexamethyldisiloxane, octamethyltrisiloxane, etc. For one embodiment, the dielectric material is deposited in the trenches and overlying hard mask layer 404 and spacers 412, such as by blanket deposition. The dielectric material may then be removed from the hard mask layer 404, e.g., using chemical mechanical polishing (CMP), so that an upper surface of each of the isolation regions 414 is substantially flush with an upper surface of the hard mask layer 404, thereby producing the structure of FIG. 4D. Isolation regions 414 define active regions 420, where an isolation region 414 is located between successive active regions 420, as shown in FIG. 4D. Each active region defines a site on which a future memory cell will be formed, as described below.

Figure 4E:
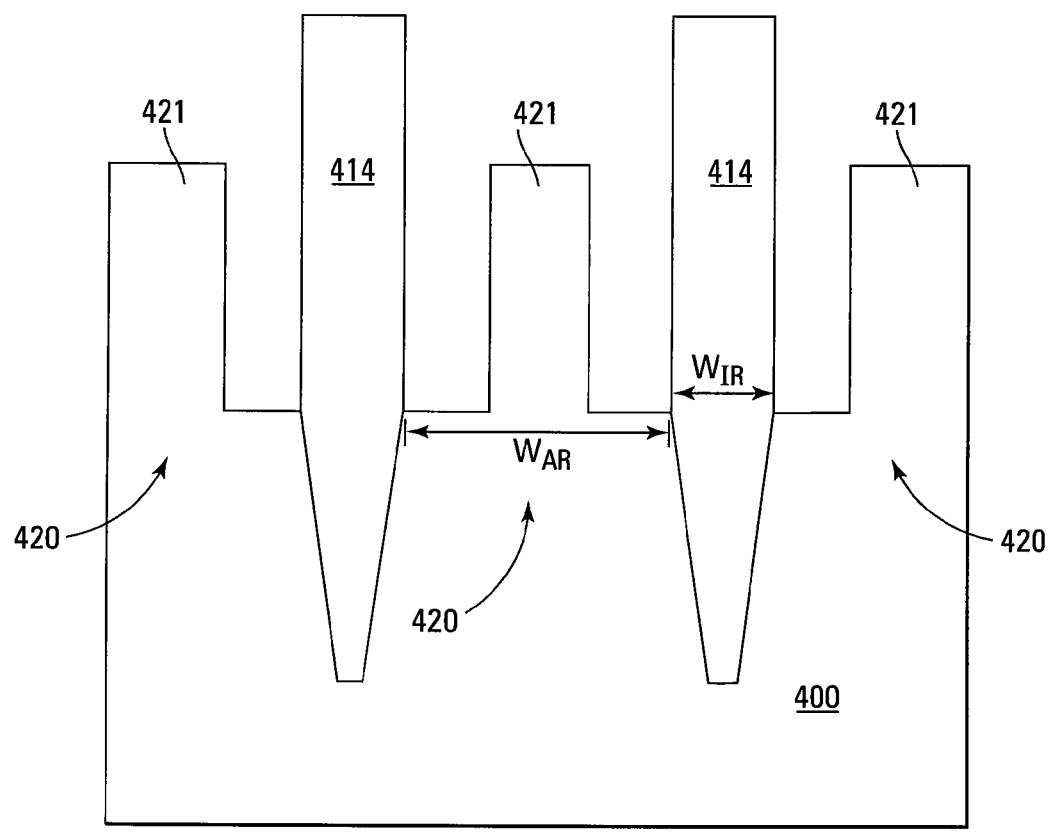

Hard mask layer 404, spacers 412, and sacrificial layer 402 are removed in FIG. 4E, such as by etching, e.g., using a wet or dry etch, exposing portions of substrate 400 corresponding to active regions 420. This forms an elongated protuberance (or fin) 421 in each active region 420, as shown in FIG. 4E. Note that an isolation region is located between successive fins 421. Although FIG. 4E shows the width $W_{AR}$ of the active regions to be greater than the width $W_{IR}$ of the isolation regions, for some embodiments, the width $W_{IR}$ of the isolation regions may be greater than or equal to the width $W_{AR}$ of the active regions (e.g., see FIG. 8B). For one embodiment, the ratio of the width $W_{IR}$ of the isolation regions to the width $W_{AR}$ of the active regions $W_{IR}/W_{AR}$ is about 1.3:1.

Figure 4F:
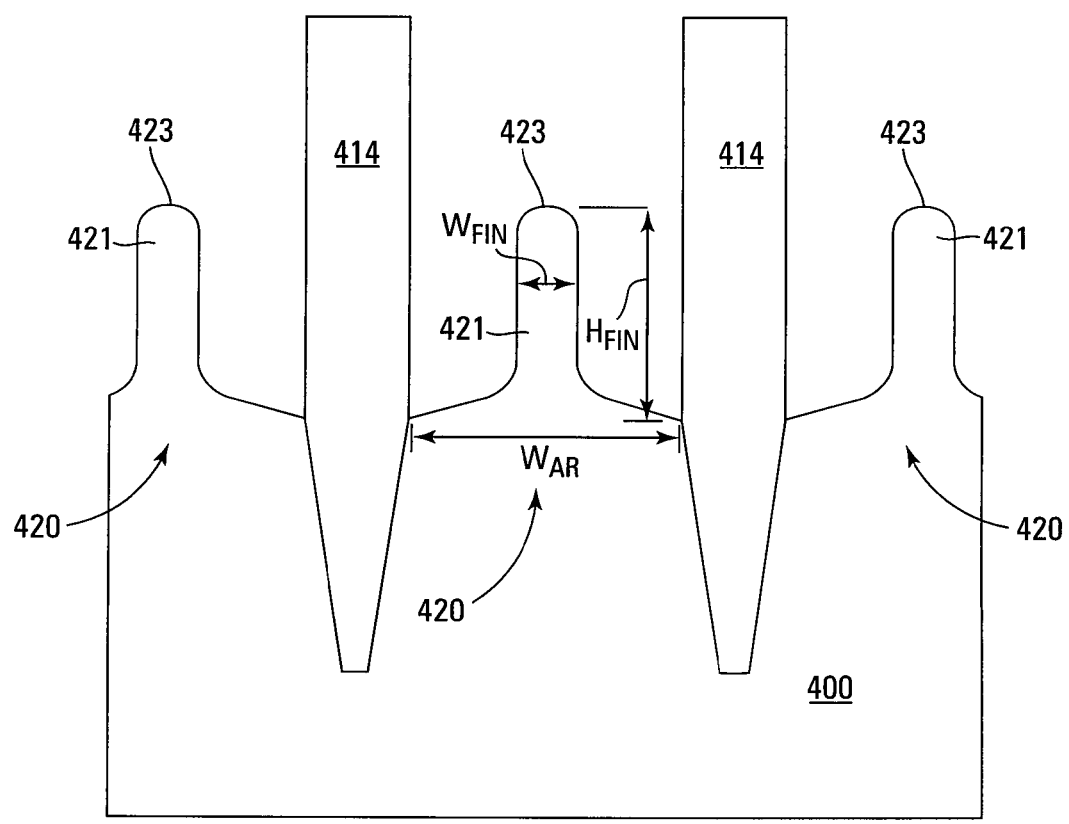

The exposed active regions 420 (or portions of substrate 400), including fins 421, are isotropically etched in FIG. 4F to decrease the height and width of the fins 421 of FIG. 4E and to form a rounded upper surface 423 on each fin 421. For one embodiment, the aspect ratio $H_{Fin}/W_{Fin}$ (the ratio of the height $H_{Fin}$ of fins 421 to the width $W_{Fin}$ of the fins 421) is about 2:1 to about 10:1. For one embodiment, fins 421 protrude substantially from the centers of their respective active regions.

Figure 4G:
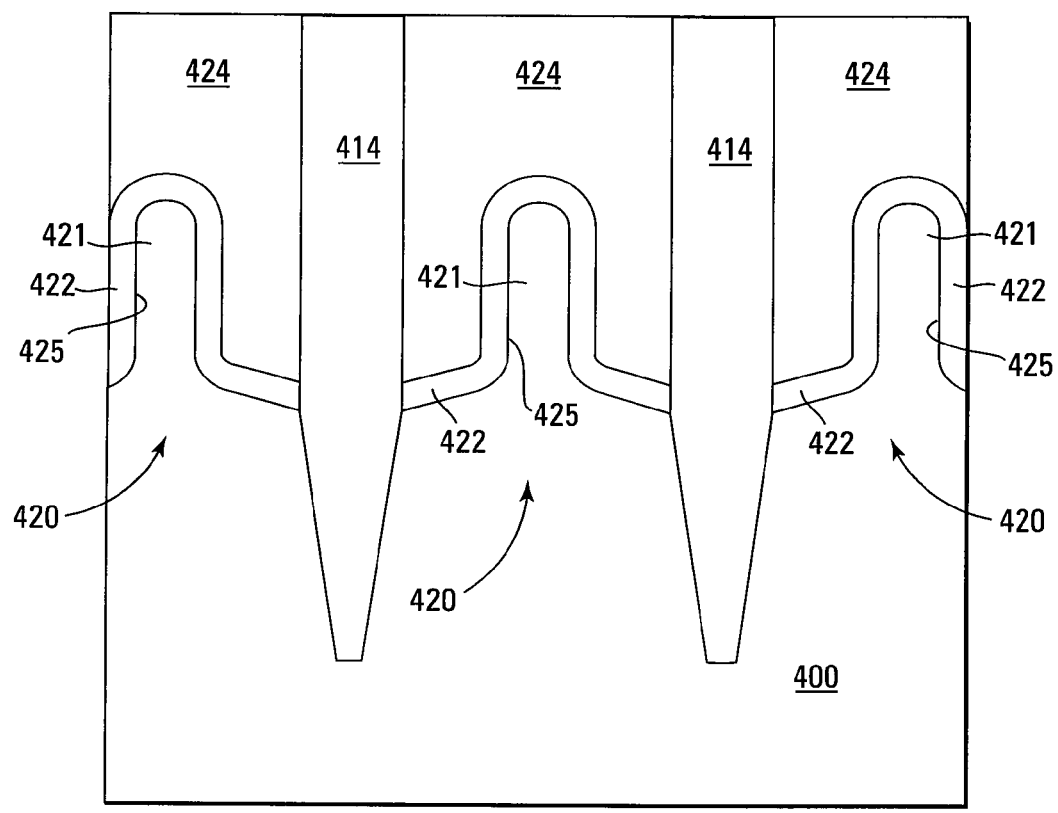

A dielectric layer 422, e.g., a tunnel oxide, is then formed on the exposed portions of substrate 400, i.e., on active regions 420, including fins 421, in FIG. 4G. The dielectric layer 422 formed on each active region 420 forms a tunnel dielectric layer of the memory cell to be formed on that active region 420. Dielectric layer 422 further defines a channel region 425 in each active region 420 on the sidewalls and upper surface of each of fins 421.

A floating gate 424 is formed overlying the dielectric layer 422 formed on each active region 420 in FIG. 4G. For one embodiment, floating gates 424 are formed by forming a conductive layer, e.g., a layer of doped polysilicon, overlying the dielectric layer 422 formed on each active region 420 and isolation regions 414 in FIG. 4G, e.g., using a blanket deposition. For another embodiment, portions of the conductive layer overlying isolation regions 414 are removed from isolation regions 414, e.g., using chemical mechanical polishing (CMP), so that an upper surface of each floating gate 424 is substantially flush with the upper surfaces of isolation regions 414, as shown in FIG. 4G.

Figure 4H:
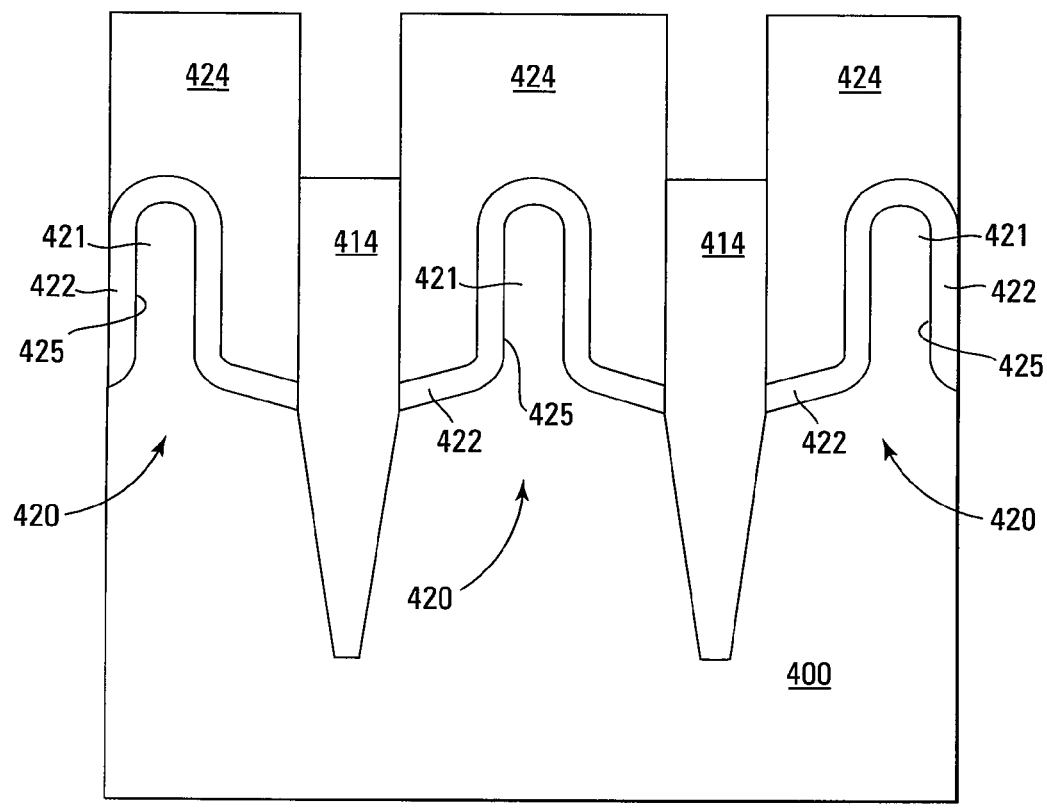
Figure 4I:
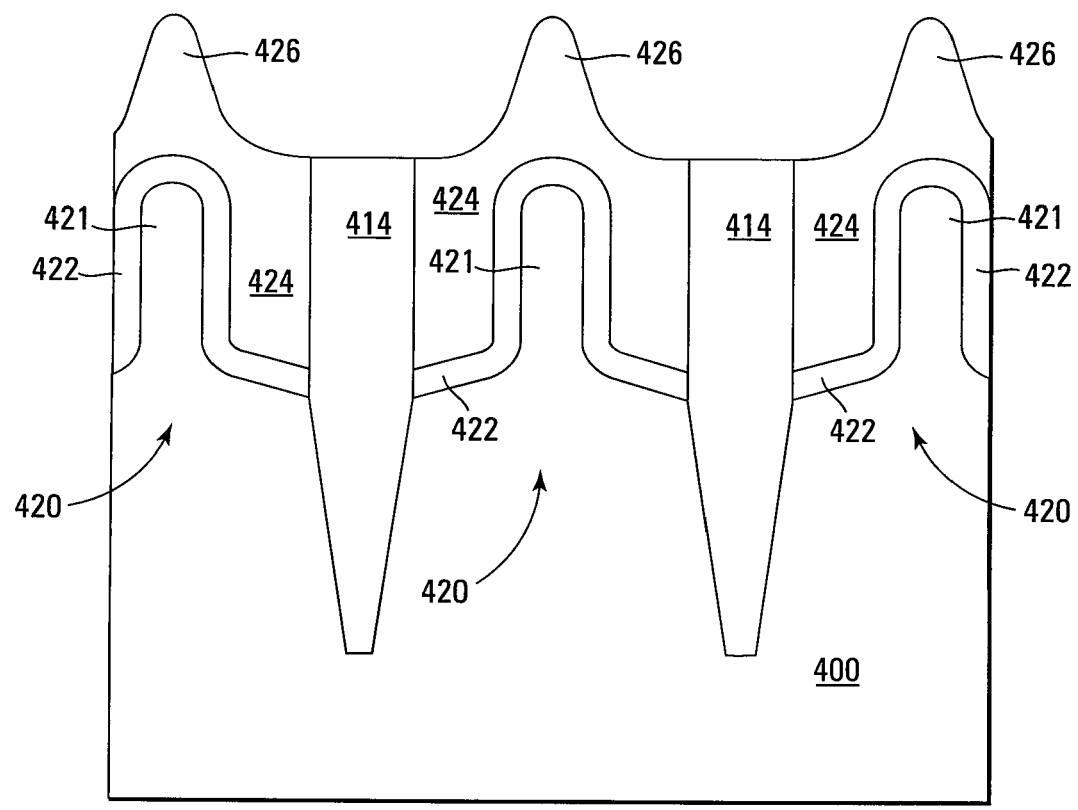

In FIG. 4H, a portion of each of isolation regions 414 is removed, such as by etching in an etch-back process, so that the upper surfaces of isolation regions 414 are recessed below the upper surfaces of floating gates 424. For one embodiment, the portions of floating gates 424 overlying the upper surfaces of the recessed isolation regions 414 are isotropically etched to have elongated protrusions (or fins) 426 in FIG. 4I. For one embodiment, fins 426 are aligned with fins 421, as shown in FIG. 4I.

Figure 4J:
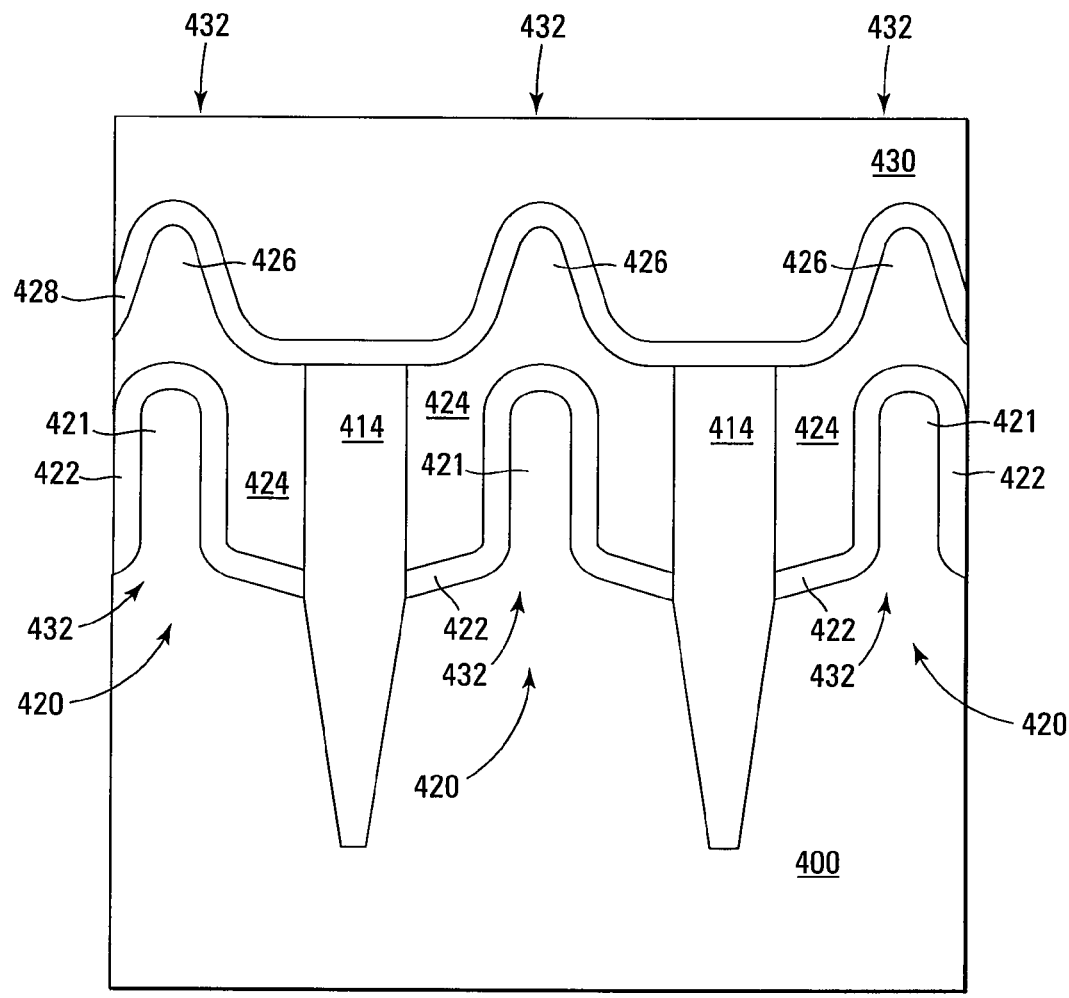

A dielectric layer 428 is formed overlying isolation regions 414 and floating gates 424 in FIG. 4J, e.g., using a blanket deposition. For another embodiment, dielectric layer 428 may be one or more layers of dielectric material. For example, dielectric layer 428 could be of a multi-layer dielectric material commonly referred to as ONO (oxide-nitride-oxide). Other dielectric materials may be substituted for the ONO, such as tantalum oxide, barium strontium titanate, silicon nitride, and other materials providing dielectric properties. Dielectric layer 428 forms an intergate dielectric layer of the memory cells overlying each active region 420.

For one embodiment, a conductive layer 430 is formed on dielectric layer 428 in FIG. 4J. Conductive layer 430 forms a control gate layer (or word line) of the memory cells overlying each active region 420, hereinafter memory cells 432, e.g., floating-gate memory cells (or floating-gate transistors). Each memory cell 432 includes a dielectric layer 422, a floating gate 424 overlying the dielectric layer 422, a portion of dielectric layer 428 overlying the floating gate 424, and a portion of conductive layer 430 overlying the portion of dielectric layer 428.

Conductive layer 430 is generally one or more layers of conductive material. For one embodiment, conductive layer 430 contains a conductively doped polysilicon. For a further embodiment, conductive layer 430 includes a metal-containing layer overlying a polysilicon layer, e.g., a refractory metal silicide layer formed on a conductively doped polysilicon layer. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. For another embodiment, conductive layer 430 contains multiple metal-containing layers, e.g., a titanium nitride (TiN) barrier layer on dielectric layer 428, a titanium (Ti) adhesion layer on the barrier layer, and a tungsten (W) layer on the adhesion layer. An insulative cap layer (not shown) is often formed overlying conductive layer 430 to protect and isolate conductive layer 430 from further processing.

Figure 5:
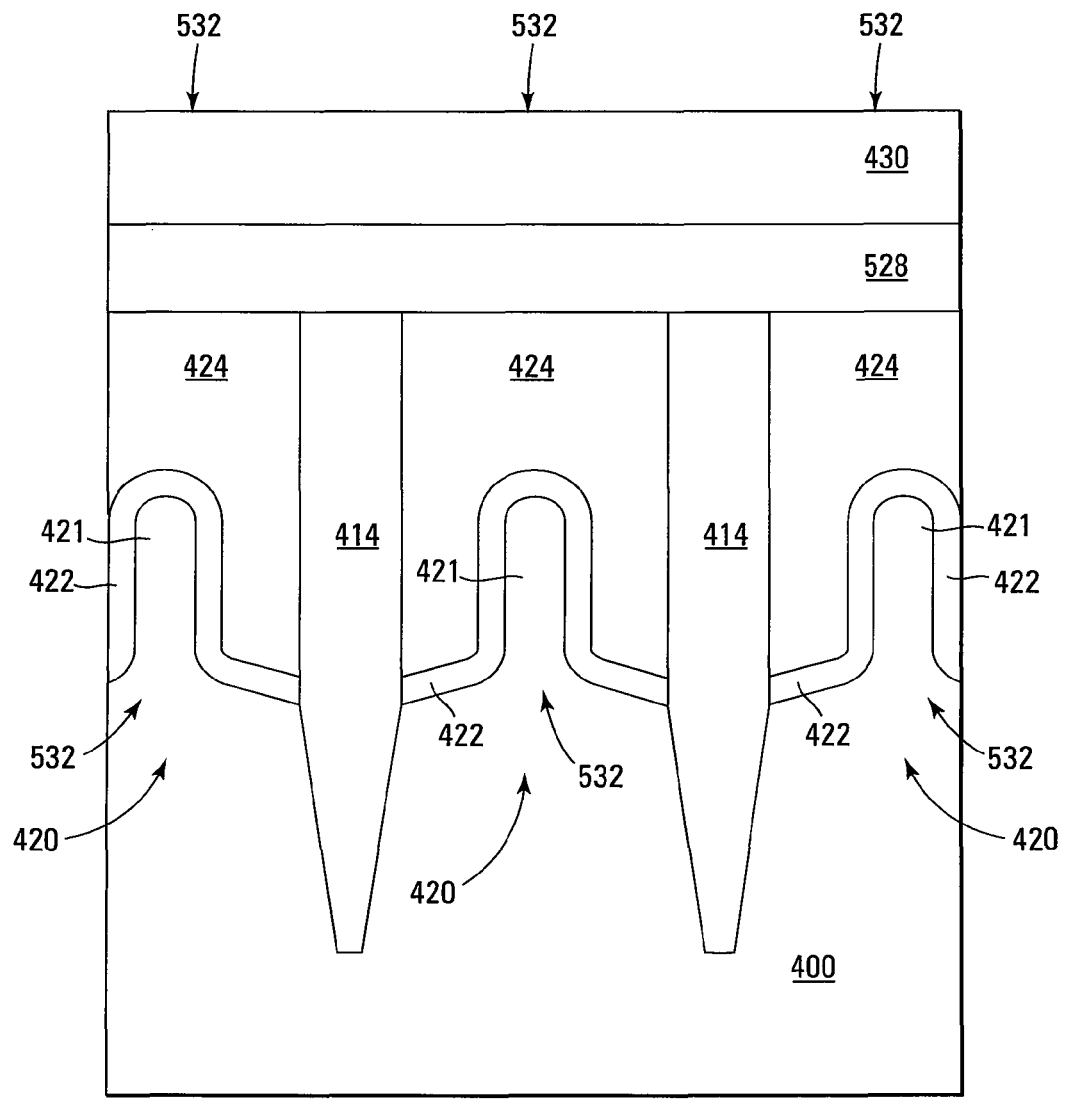
FIG. 5 is a cross-sectional view of a portion of a row of a memory array, according to another embodiment of the disclosure.

For another embodiment, a dielectric layer 528 is formed overlying the structure of FIG. 4G, as shown in FIG. 5. That is, dielectric layer 528 is formed overlying isolation regions 414 and floating gates 424. For one embodiment, dielectric layer 528 is of a dielectric material having a relatively high dielectric constant (e.g., relative to an effective dielectric constant for an ONO layer), such as alumina (or aluminum oxide, $Al_2O_3$) or other high-dielectric-constant material. Conductive layer 430 is then formed on dielectric layer 528 in FIG. 5 to form memory cells 532, e.g., floating-gate memory cells (or floating-gate transistors), that respectively overlie active regions 420. Each memory cell 532 includes a dielectric layer 422, a floating gate 424 overlying the dielectric layer 422, a portion of dielectric layer 528 overlying the floating gate 424, and a portion of conductive layer 430 overlying the portion of dielectric layer 528. Note that dielectric layer 528 forms an intergate dielectric layer of each of memory cells 532 and that conductive layer 430 forms a control gate layer of each of memory cells 532.

Figure 6A:
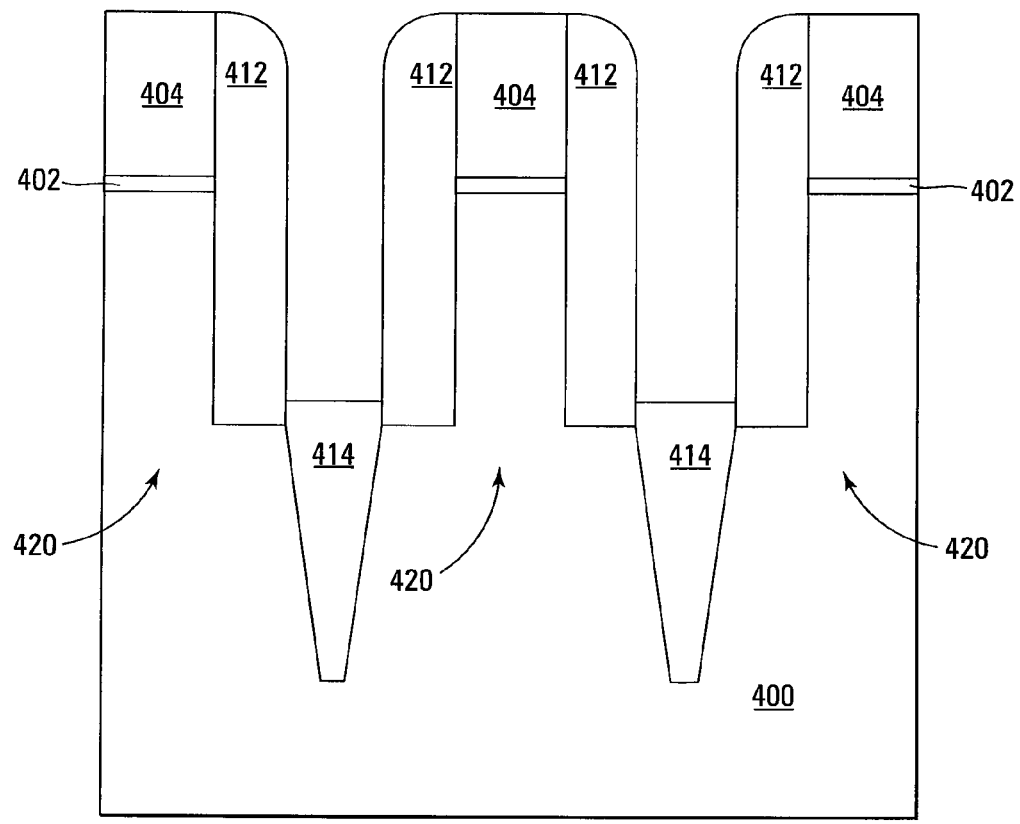
FIGS. 6A-6F are cross-sectional views of a portion of a row of a memory array during various stages of fabrication, according to another embodiment of the disclosure.

FIGS. 6A-6F are cross-sectional views of a portion of a row of a memory array, such as a portion of a row of memory array 200 of FIG. 2 or a portion of a row of memory array 104 of FIG. 1, during various stages of fabrication, according to an embodiment. FIG. 6A is formed by removing a portion of each of isolation regions 414 of the structure of FIG. 4D, such as by etching in an etch-back process, so that upper surfaces of isolation regions 414 are recessed below hard mask layer 404, sacrificial layer 402 and an upper surface of substrate 400.

Figure 6B:
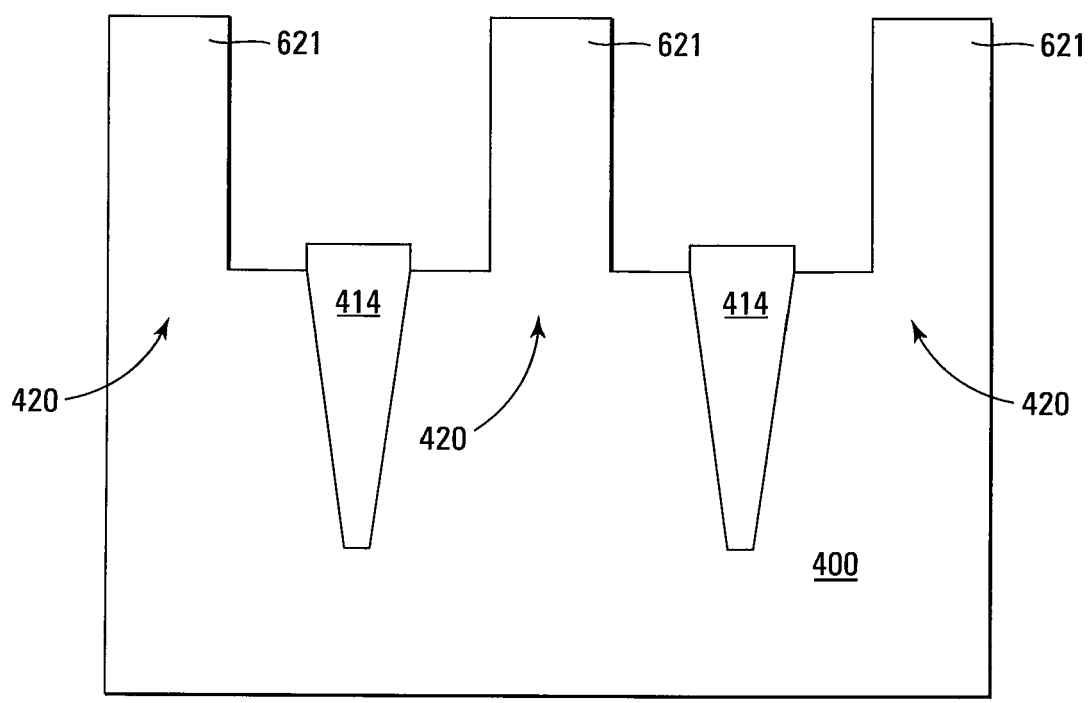
Figure 6C:
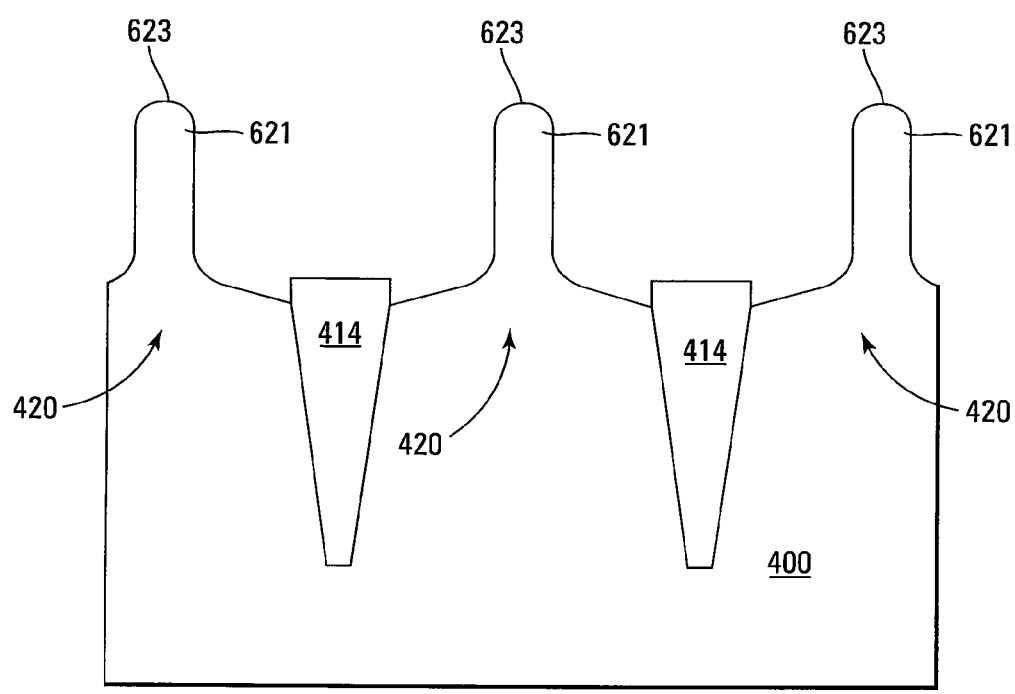

Hard mask layer 404, spacers 412, and sacrificial layer 402 are removed in FIG. 6B, exposing portions of substrate 400 corresponding to active regions 420. This forms an elongated protuberance (or fin) 621 in each active region 420, as shown in FIG. 6B. The exposed active regions 420 (or portions of substrate 400), including fins 621, are isotropically etched in FIG. 6C to decrease the height and width of the fins 621 of FIG. 6B and to form a rounded upper surface 623 on each fin 621. For one embodiment, fins 621 protrude substantially from the centers of their respective active regions 420.

Figure 6D:
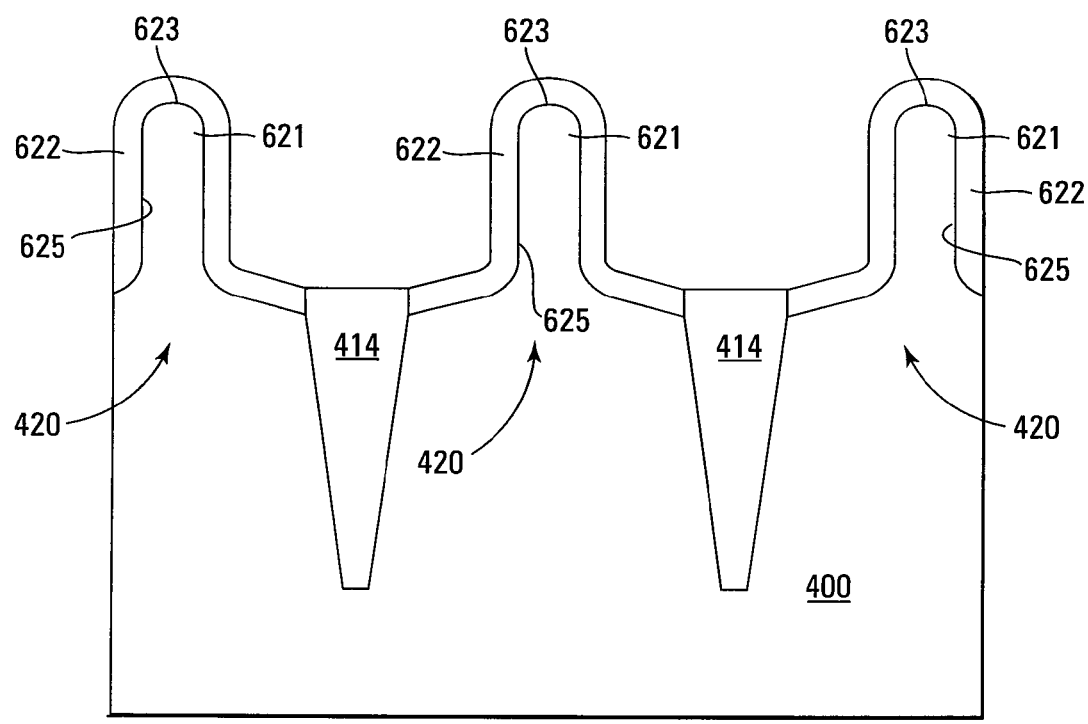

A dielectric layer 622, e.g., a tunnel oxide, is then formed on the exposed portions of substrate 400, i.e., on active regions 420, including fins 621, in FIG. 6D. The dielectric layer 622 formed on each active region 420 forms a tunnel dielectric layer of the memory cell to be formed on that active region 420. Dielectric layer 622 further defines a channel region 625 in each active region 420 on the sidewalls and upper surface of each of fins 621. A conductive layer 623, e.g., a layer of doped polysilicon, is formed overlying dielectric layer 622 and isolation regions 414 in FIG. 6E, e.g., using a blanket deposition.

Figure 6E:
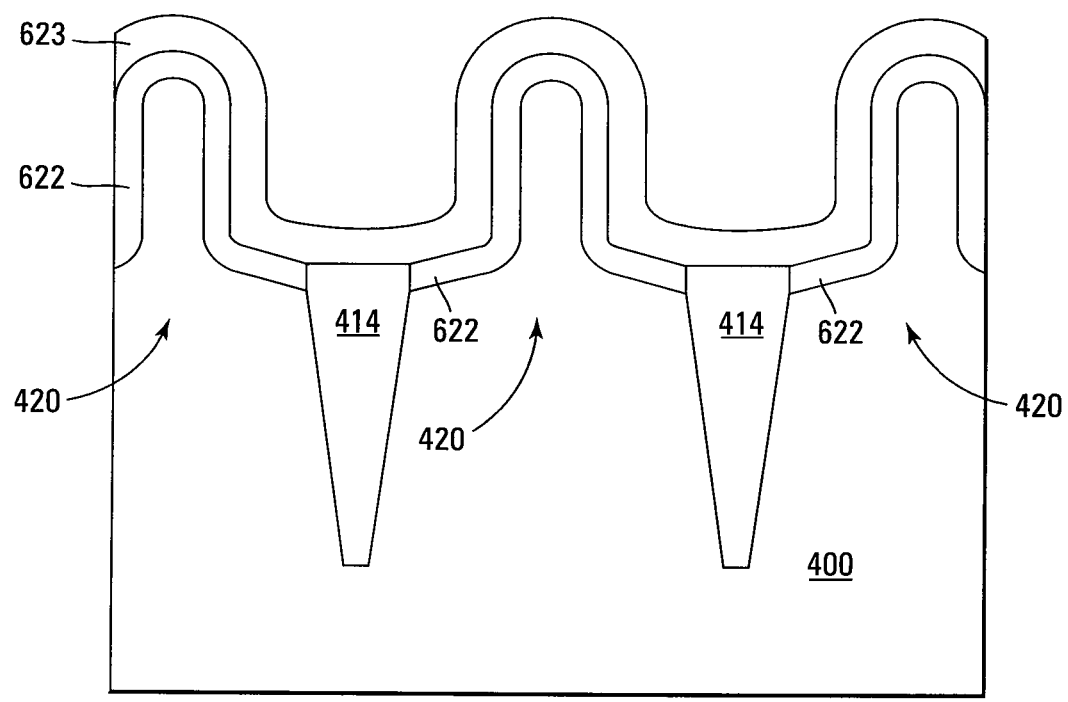
Figure 6F:
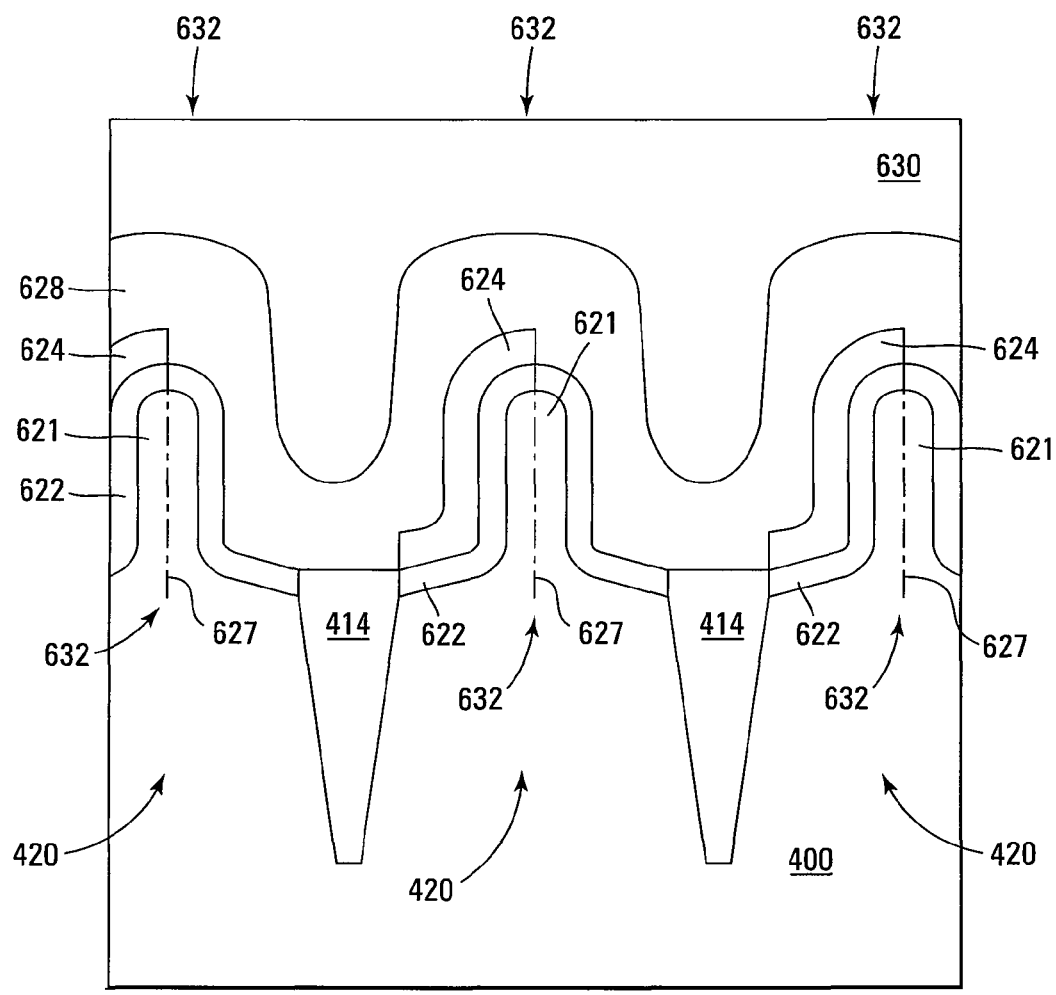

In FIG. 6F, portions of conductive layer 623 are removed, such as by anisotropic etching, e.g., using a chemical wet etch or a plasma dry etch, exposing portions of dielectric layer 622 formed on each active region 420 and isolation regions 414. The remaining portions of conductive layer 623 respectively form floating gates 624 that respectively overlie active regions 420. Specifically, for one embodiment, a floating gate 624 overlies about half of a fin 621 of each active area 420, as shown in FIG. 6F. For another embodiment, each floating gate 624 terminates at a location generally coinciding with an axis 627 that bisects a width, in the row direction, of a corresponding fin 621, as shown in FIG. 6F.

A dielectric layer 628, e.g., similar to dielectric layer 428 discussed above in conjunction with FIG. 4J for one embodiment, is formed overlying floating gates 624, the exposed portions of dielectric layer 622 formed on each active region 420, and isolation regions 414 in FIG. 6F. A conductive layer 630, e.g., similar to conductive layer 430 discussed above in conjunction with FIG. 4J for one embodiment, is then formed overlying dielectric layer 628 in FIG. 6F to form memory cells 632, e.g., floating-gate memory cells (or floating-gate transistors), that respectively overlie active regions 420. Each memory cell 632 includes a dielectric layer 622, a floating gate 624 overlying the dielectric layer 622, a portion of dielectric layer 628 overlying the floating gate 624, and a portion of conductive layer 630 overlying the portion of dielectric layer 628. Note that dielectric layer 628 forms an intergate dielectric layer of each of memory cells 632 and that conductive layer 630 forms a control gate layer of each of memory cells 632.

Note that removing the portions of conductive layer 623 forms a separation between a terminal end of each resulting floating gate 624 and a subsequent isolation region 414. For example, for the embodiment where each floating gate 624 terminates at a location generally coinciding with an axis 627 a separation is formed between the axis 627 and an isolation region 414, as shown in FIG. 6F. The separations help reduce floating-gate-to-floating-gate interference along the row (or the word line).

Figure 7:
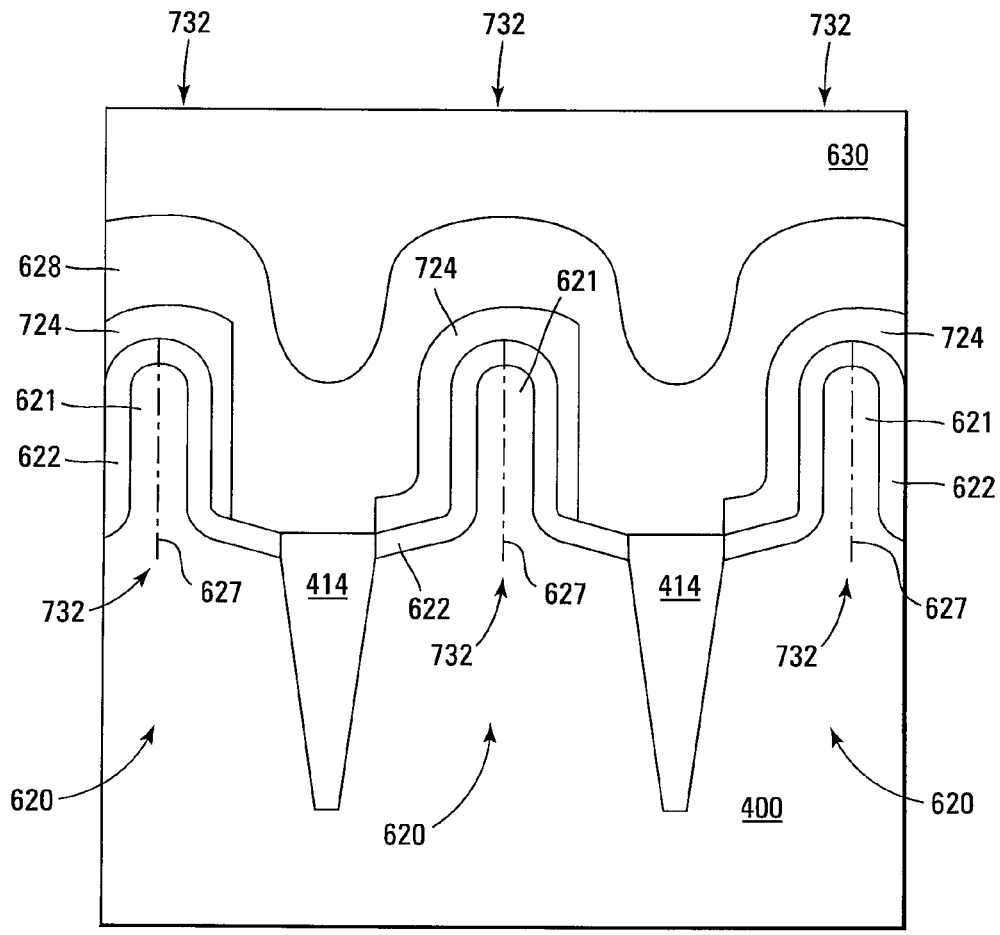
FIG. 7 is a cross-sectional view of a portion of a row of a memory array, according to another embodiment of the disclosure.

In FIG. 7, for another embodiment, portions of conductive layer 623 of FIG. 6E are removed, such as by anisotropic etching, to form floating gates 724 that respectively overlie active regions 420. Specifically, for one embodiment, a floating gate 724 overlies more than half of a fin 621 of each active area 420, as shown in FIG. 7. For another embodiment, each floating gate 724 extends past the location that coincides with the axis 627 that bisects the width, in the row direction, of the corresponding fin 621, as shown in FIG. 7. Each floating gate 724 forms a portion of a memory cell 732 that includes a dielectric layer 622 underlying that floating gate 724, a portion of dielectric layer 628 overlying that floating gate 724, and a portion of conductive layer 630 overlying the portion of dielectric layer 628. Note that dielectric layer 628 forms an intergate dielectric layer of each of memory cells 732 and that conductive layer 630 forms a control gate layer of each of memory cells 732.

Figure 8A:
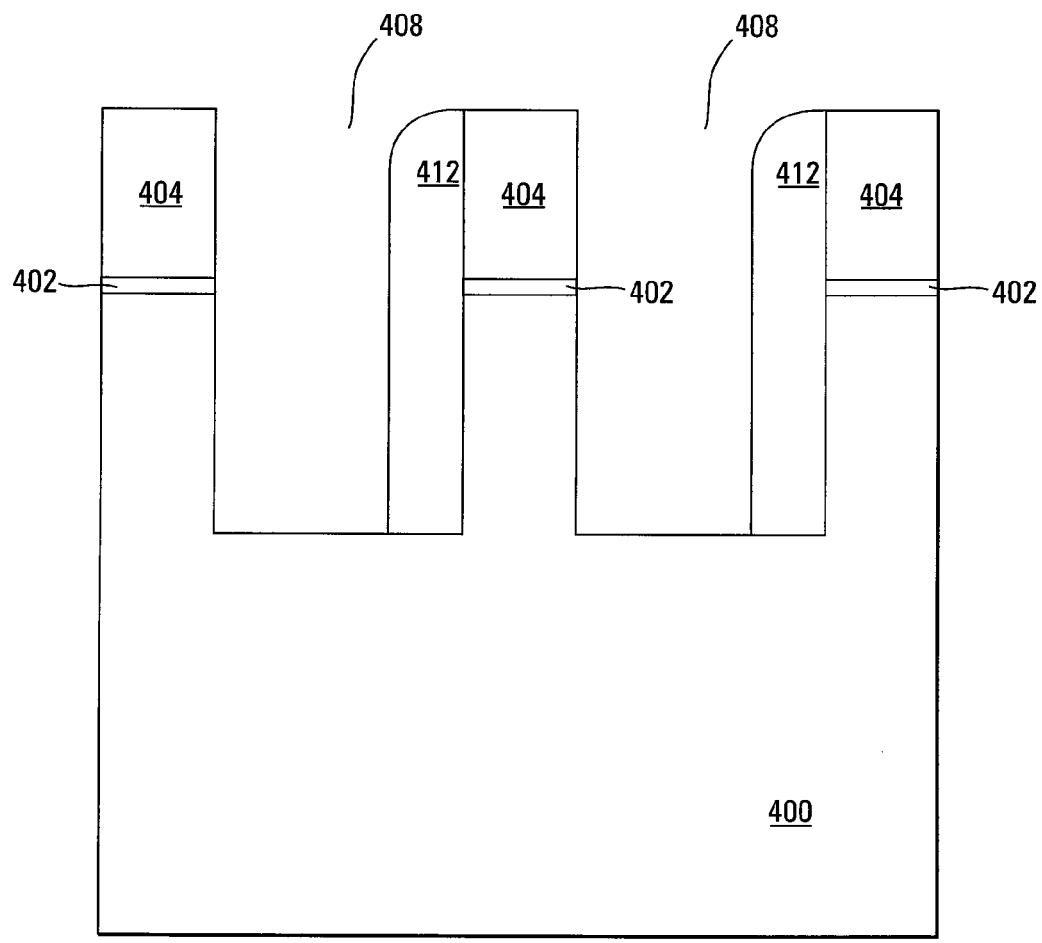
FIGS. 8A-8E are cross-sectional views of a portion of a row of a memory array during various stages of fabrication, according to another embodiment of the disclosure.
Figure 8B:
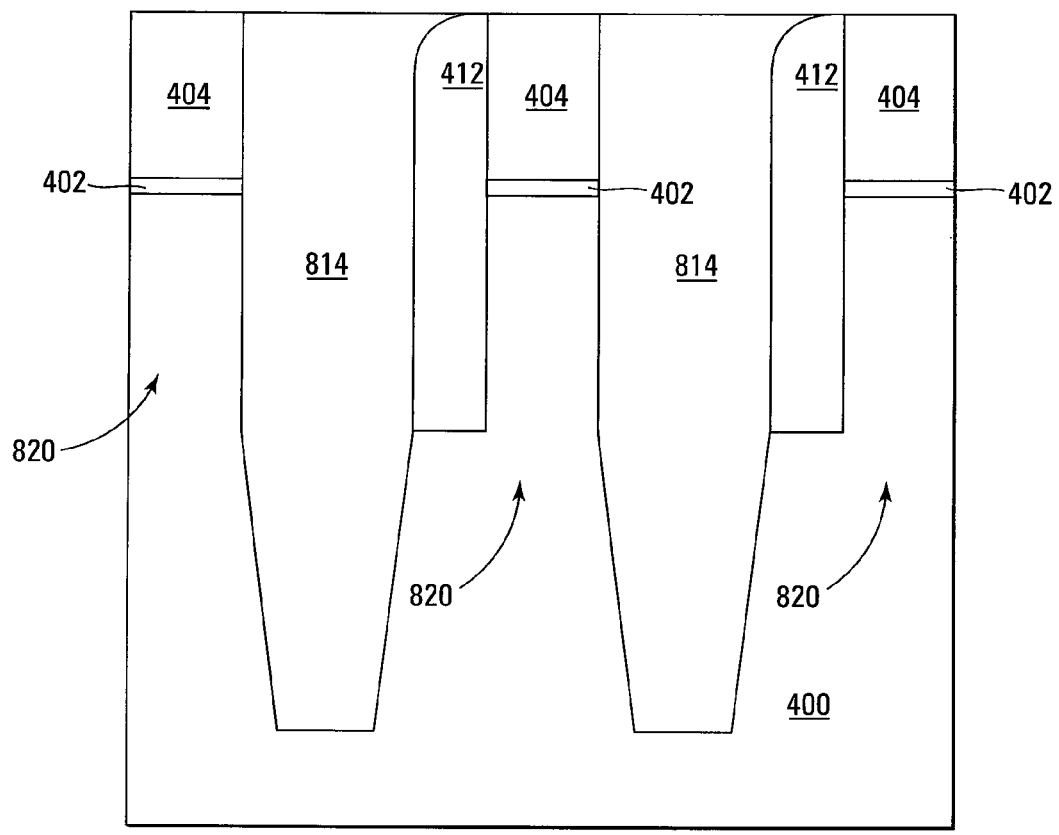

FIGS. 8A-8E are cross-sectional views of a portion of a row of a memory array, such as a portion of a row of memory array 200 of FIG. 2 or a portion of a row of memory array 104 of FIG. 1, during various stages of fabrication, according to an embodiment. FIG. 8A is formed by removing one of the two sidewalls 412 from each trench 408 of the structure of FIG. 4C. The remaining spacers 412 and hard mask layer 404 form a pattern for respectively exposing portions of substrate 400 for removal. The exposed portions substrate 400 are removed in FIG. 8B so as to extend trenches 408 further into substrate 400. Isolation regions 814, e.g., similar to isolation regions 414 discussed above in conjunction with FIG. 4D, are then formed in FIG. 8B by filling the trenches with a suitable dielectric material. Isolation regions 814 define active regions 820, where an isolation region 814 is located between successive active regions 820, as shown in FIG. 8B. Each active region defines a site on which a future memory cell will be formed, as described below.

Figure 8C:
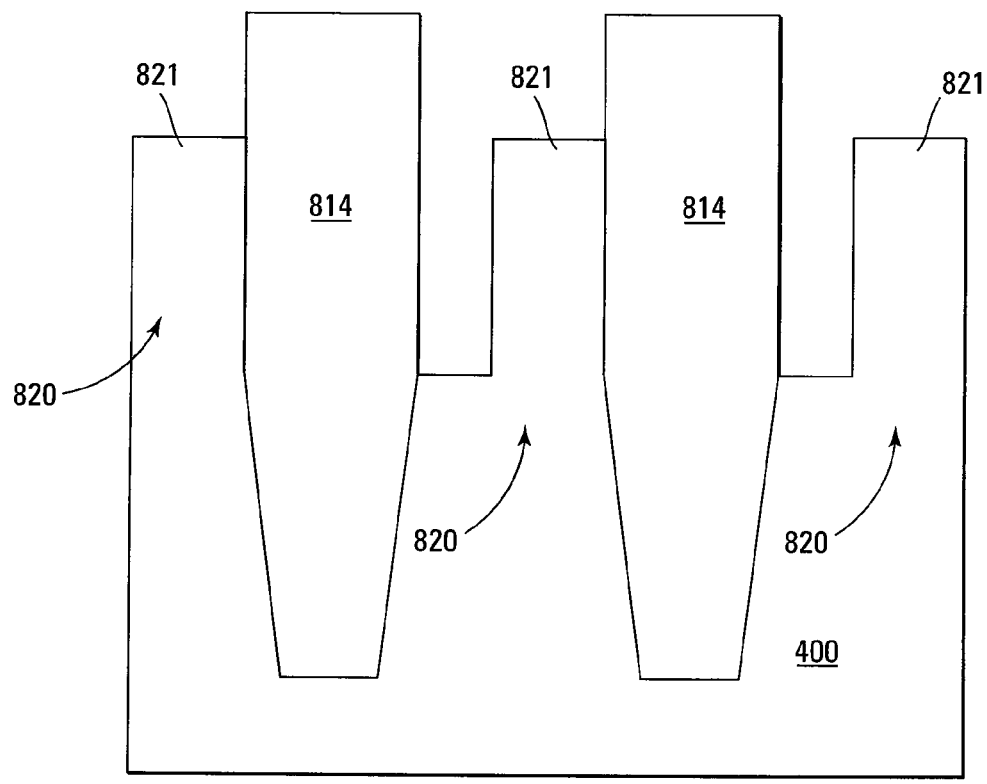

Hard mask layer 404, spacers 412, and sacrificial layer 402 are removed in FIG. 8C, exposing portions of substrate 400 corresponding to active regions 820. This forms a fin 821 in each of the active regions 820 that is offset from the center of the respective active region 820. For one embodiment, a sidewall of fin 821 in each of the active regions 820 is adjacent and in contact with a sidewall of an isolation region 814, as shown in FIG. 8C.

Figure 8D:
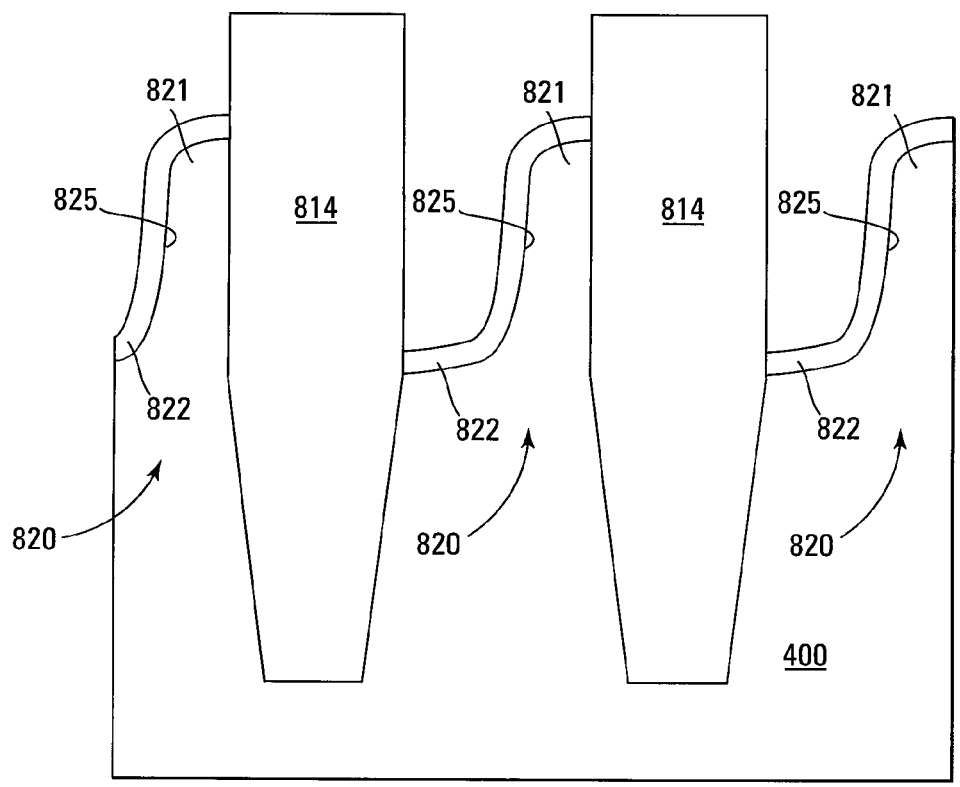

A dielectric layer 822, e.g., a tunnel oxide, is then formed on the exposed portions of substrate 400, i.e., on active regions 820, including a sidewall and an upper surface of each fin 821, in FIG. 8D. The dielectric layer 822 formed on each active region 820 forms a tunnel dielectric layer of the memory cell to be formed on that active region 820. Dielectric layer 822 further defines a channel region 825 in each active region 820 on a sidewall and upper surface of each of fins 821. Note that when dielectric layer 822 is an oxide layer, the oxidation of the exposed portions of substrate 400 or fins 821 acts to round the corners of the exposed portions of substrate 400 or fins 821, as shown in FIG. 8D.

Figure 8E:
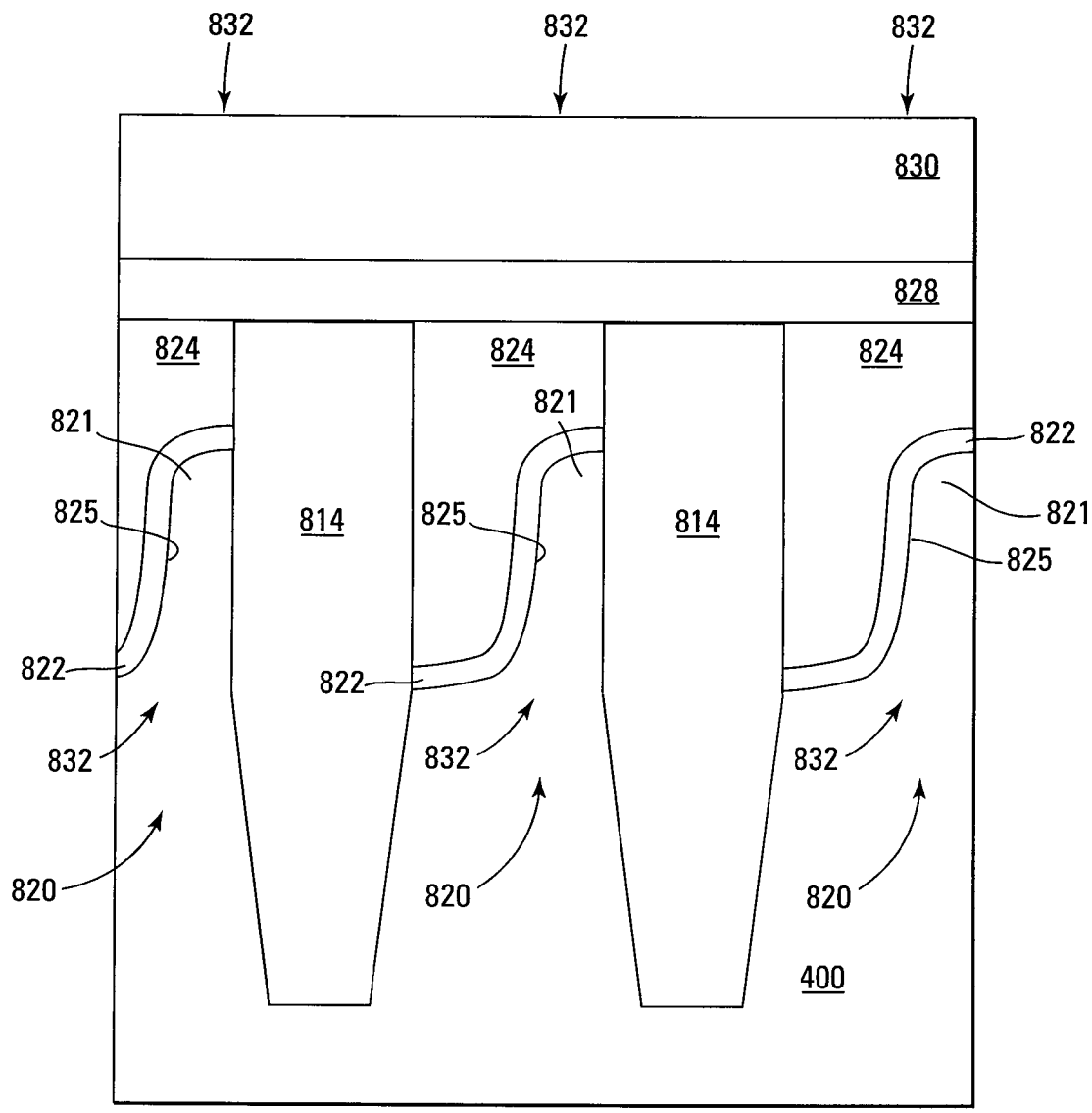

A floating gate 824 is formed overlying the dielectric layer 822 formed on each active region 820 in FIG. 8E. For one embodiment, floating gates 824 are formed by forming a conductive layer, e.g., a layer of doped polysilicon, overlying the dielectric layer 822 formed on each active region 820 and isolation regions 814 in FIG. 8E, e.g., using a blanket deposition. For another embodiment, portions of the conductive layer overlying isolation regions 814 are removed from isolation regions 814, e.g., using chemical mechanical polishing (CMP), so that an upper surface of each floating gate 824 is substantially flush with the upper surfaces of isolation regions 814, as shown in FIG. 8E.

A dielectric layer 828, e.g., similar to dielectric layer 428 discussed above in conjunction with FIG. 4J for one embodiment, is formed overlying isolation regions 814 and floating gates 824 in FIG. 8E, e.g., using a blanket deposition. A conductive layer 830, e.g., similar to conductive layer 430 discussed above in conjunction with FIG. 4J for one embodiment, is then formed overlying dielectric layer 828 in FIG. 8E to form memory cells 832, e.g., floating-gate memory cells (or floating-gate transistors), that respectively overlie active regions 420.

Each memory cell 832 includes a dielectric layer 822, a floating gate 824 overlying the dielectric layer 822, a portion of dielectric layer 828 overlying the floating gate 824, and a portion of conductive layer 830 overlying the portion of dielectric layer 828. Note that dielectric layer 828 forms an intergate dielectric layer of each of memory cells 832 and that conductive layer 830 forms a control gate layer (or word line) of each of memory cells 832.

It is noted that the foregoing cross sectional views (i.e., of FIGS. 4A-4J, FIG. 5, FIGS. 6A-6F, FIG. 7, and FIGS. 8A-8E) depict a portion of a row of memory cells running parallel to a face plane of the drawings. Columns of memory cells, separated by the isolation regions of the figures, run perpendicular to the drawings, with source and drain regions formed at opposing ends of the tunnel dielectric layers, one above the face plane of the figures and one below the face plane of the figures. It is noted that the foregoing cross sectional views can depict a NOR- NAND-, NROM-, or AND-type memory device, with the differences occurring in the column direction in manners that are well understood in the art of memory fabrication.

Figure 9A:
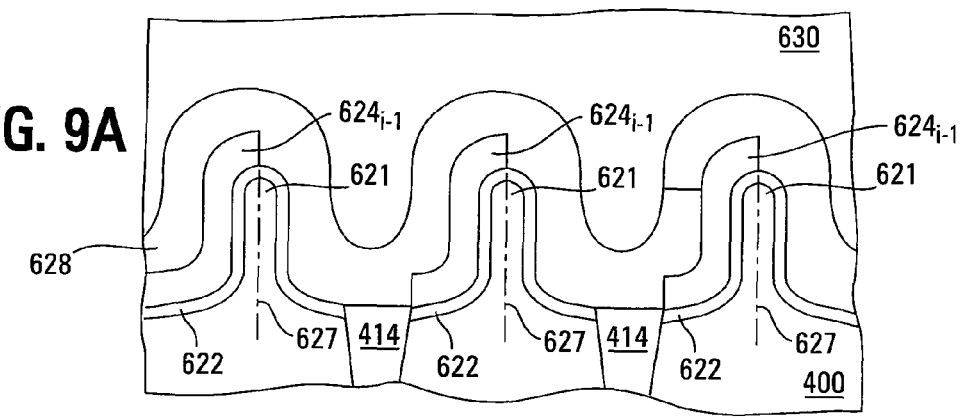
FIGS. 9A-9C are respectively cross-sectional views of portions of successive rows of a memory array, according to another embodiment of the disclosure.
Figure 9B:
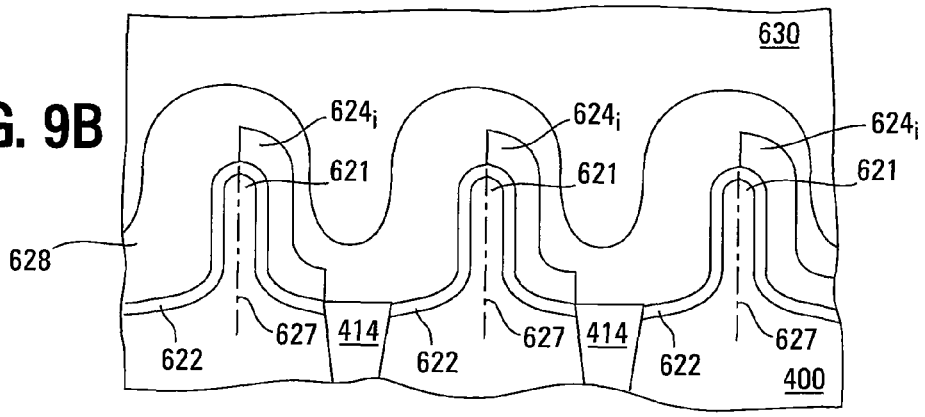
Figure 9C:
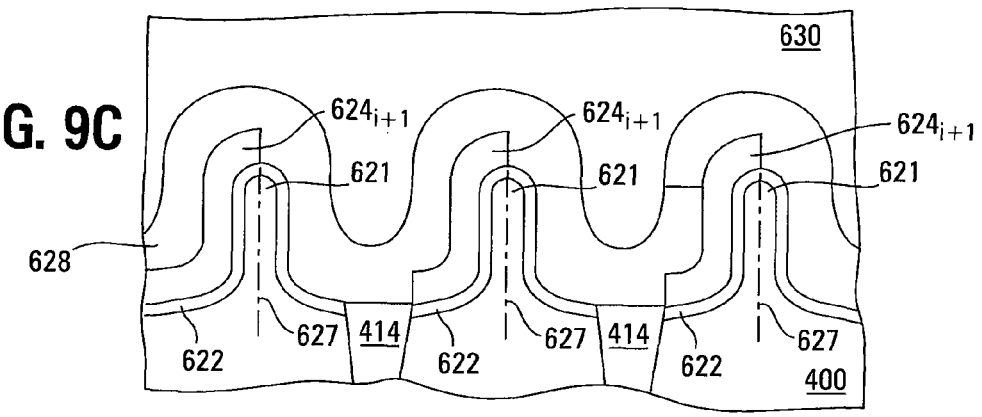

FIGS. 9A-9C are respectively cross-sectional views of portions of successive rows, e.g., respectively corresponding to successive word lines 202 of FIG. 2, according to another embodiment. Note the cross-sections of FIGS. 9A-9C are formed as described above in conjunction with FIGS. 6A-6F and therefore FIGS. 9A-9C and FIGS. 6A-6F use common reference numbers. The floating gates 624 of every other row are formed on the same side, e.g., the same half or same side of the bisecting axis 627, of their corresponding fins 621. On the other hand, the floating gates 624 of an intervening row (i.e., a row between the every other rows having their floating gates on the same side of their fins 621) are formed on a side (or side of the bisecting axis 627) of their corresponding fins 621 that is opposite to the side (or side of the bisecting axis 627) of the fins 621 on which the floating gates of the every other rows are formed. For example, floating gates $624_{i-1}$ and $624_{i+1}$, respectively of row i−1 and row i+1, are formed on the same side (or side of the bisecting axis 627) of their corresponding fins, whereas floating gates $624_i$ of row i, located between row i−1 and row i+1, are formed on a side (or side of the bisecting axis 627) of their corresponding fins 621 that is opposite to the side (or side of the bisecting axis 627) of the fins 621 on which floating gates 624$_{i-1}$ and 624$_{i+1}$ respectively of row i−1 and row i+1 are formed, as shown in FIGS. 9A-9C. In other words, the floating gates 624 of every other row face in the same direction, whereas the floating gates 624 of an intervening row faces in a direction opposite to the floating gates of the every other rows. This configuration tends to reduce capacitive coupling of the floating gates in adjacent rows.

Figure 10A:
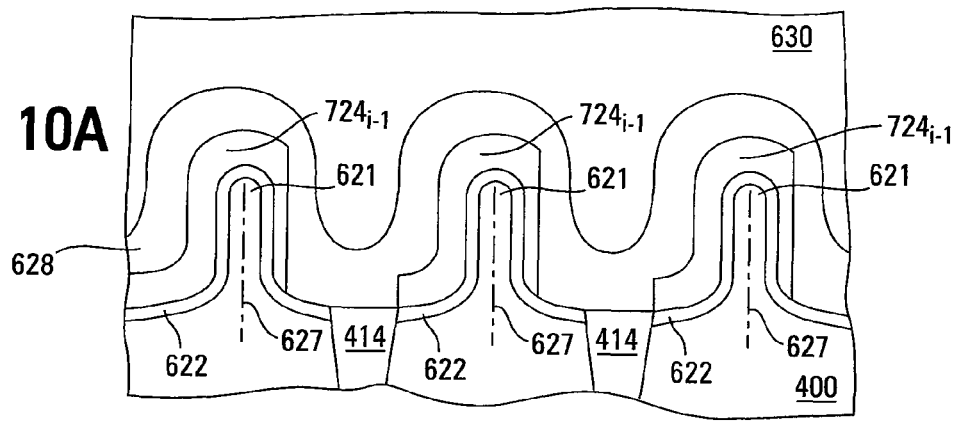
FIGS. 10A-10C are respectively cross-sectional views of portions of successive rows of a memory array, according to another embodiment of the disclosure.
Figure 10B:
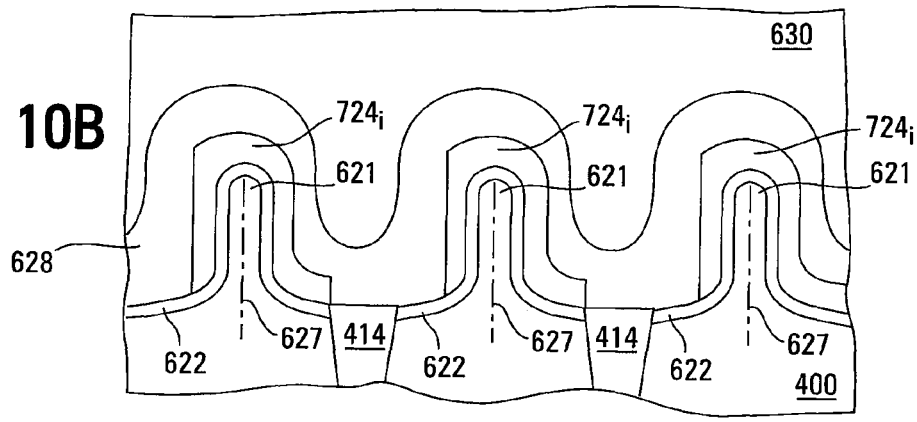
Figure 10C:
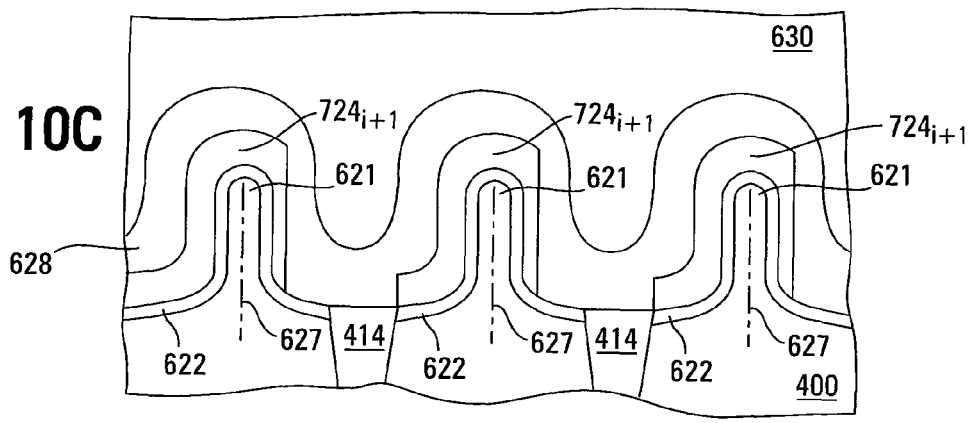

FIGS. 10A-10C are respectively cross-sectional views of portions of successive rows, e.g., respectively corresponding to successive word lines 202 of FIG. 2, according to another embodiment. Note the cross-sections of FIGS. 10A-10C are formed as described above in conjunction with FIGS. 6A-6E and 7 and therefore FIGS. 10A-10C and FIGS. 6A-6E and 7 use common reference numbers. The floating gates 724 of every other row extend in the same direction past the location coinciding with the bisecting axis 627 of their corresponding fins 621, whereas the floating gates 724 of an intervening row extend in a direction past the location coinciding with the bisecting axis 627 of their corresponding fins 621 that is opposite to that of the floating gates 724 of the every other rows. For example, as shown in FIGS. 1A-1C, floating gates 724$_{i-1}$ and 724$_{i+1}$, respectively of row i−1 and row i+1, extend in the same direction past the location coinciding with the bisecting axis 627 of their corresponding fins 621, whereas floating gates 724$_i$ of row i, located between row i−1 and row i+1, extend in a direction past the location coinciding with the bisecting axis 627 of their corresponding fins 621 that is opposite to that of the floating gates 724$_{i-1}$ and 724$_{i+1}$, respectively of row i−1 and row i+1. In other words, the floating gates 724 of every other row face in the same direction, whereas the floating gates 724 of an intervening row faces in a direction opposite to the floating gates of the every other rows.

CONCLUSION

Although specific embodiments have been illustrated and described herein it is manifestly intended that the scope of the claimed subject matter be limited only by the following claims and equivalents thereof.

What is claimed is:

1. A memory array, comprising:
a plurality fins protruding from a substrate;
a tunnel dielectric layer overlying the fins;
a plurality floating gates overlying the tunnel dielectric layer so that each floating gate overlies a portion of a fin;
an intergate dielectric layer overlying the floating gates; and
a control gate layer overlying the intergate dielectric layer;
wherein each fin comprises a rounded upper surface; and
wherein each floating gate overlying a portion of a fin terminates at a location that overlies the rounded upper surface of that fin.

2. The memory array of claim 1, wherein the location at which a floating gate overlying a portion of a fin terminates coincides with an axis that bisects a width of that fin.

3. A memory array, comprising:
a plurality fins protruding from a substrate;
a tunnel dielectric layer overlying the fins;
a plurality floating gates overlying the tunnel dielectric layer;
an intergate dielectric layer overlying the floating gates; and
a control gate layer overlying the intergate dielectric layer;
wherein each fin comprises an upper surface rounded by isotropic etching; and
wherein each floating gate comprises a fin protruding therefrom, wherein the fin protruding from each floating gate is aligned with the fin protruding from the substrate that corresponds to that floating gate.

4. A memory array, comprising:
a plurality fins protruding from a substrate;
a tunnel dielectric layer overlying the fins;
a plurality floating gates overlying the tunnel dielectric layer;
an intergate dielectric layer overlying the floating gates; and
a control gate layer overlying the intergate dielectric layer;
wherein each fin comprises an upper surface rounded by isotropic etching;
wherein each floating gate overlies a portion of a corresponding fin that protrudes from the substrate; and
wherein each floating gate that overlies a portion of its corresponding fin that protrudes from the substrate extends past a location that coincides with an axis that bisects a width of that corresponding fin.

5. A memory array, comprising:
a plurality of isolation regions extending into a substrate;
a plurality fins protruding from the substrate;
a tunnel dielectric layer overlying the fins;
a plurality floating gates overlying the tunnel dielectric layer, each of the plurality of floating gates comprising a fin protruding therefrom;
an intergate dielectric layer overlying the floating gates; and
a control gate layer overlying the intergate dielectric layer;
wherein an isolation region is located between successive fins protruding from the substrate.

6. A memory array, comprising:
a plurality fins protruding from a substrate;
a tunnel dielectric layer overlying the fins;
a plurality floating gates overlying the tunnel dielectric layer;
an intergate dielectric layer overlying the floating gates; and
a control gate layer overlying the intergate dielectric layer;
wherein each floating gate comprises a fin protruding therefrom, wherein the fin protruding from each floating gate is aligned with a fin protruding from the substrate that corresponds to that floating gate.

7. A memory array, comprising:
a substrate;
a plurality of isolation regions formed in the substrate and defining a plurality of active regions of the substrate, wherein an isolation region is formed between a pair of successive active regions;
a fin protruding from each active region;
a floating gate memory cell formed on each active region, the memory cell comprising:
a tunnel dielectric layer formed on the active region, including the fin of that active region;
a floating gate formed on a portion of the tunnel dielectric layer;
an intergate dielectric layer formed on the floating gate and on a portion of the tunnel dielectric layer on which there is no floating gate; and
a control gate layer formed on the intergate dielectric layer.

8. The memory array of claim 7, wherein the portion of the floating gate overlies more than half of the fin.

9. A memory array, comprising:
a substrate;
a plurality of isolation regions formed in the substrate and defining a plurality of active regions of the substrate, wherein an isolation region is formed between a pair of successive active regions;
a fin protruding from each active region;
a floating gate memory cell formed, on each active region, the memory cell comprising:
- a tunnel dielectric layer formed on the active region, including the fin of that active region;
- a floating gate formed on a portion of the tunnel dielectric layer;
- an intergate dielectric layer formed on the floating gate and on a portion of the tunnel dielectric layer on which there is no floating gate; and
- a control gate layer formed on the intergate dielectric layer;
- wherein the portion of the floating gate terminates at a location coinciding with an axis that bisects a width of the fin.

10. A memory array, comprising:
a substrate;
a plurality of isolation regions formed in the substrate and defining a plurality of active regions of the substrate, wherein an isolation region is formed between a pair of successive active regions;
a fin protruding from each active region;
a floating gate memory cell formed on each active region, the memory cell comprising:
- a tunnel dielectric layer formed on the active region, including the fin of that active region;
- a floating gate formed on a portion of the tunnel dielectric layer;
- an intergate dielectric layer formed on the floating gate and on a portion of the tunnel dielectric layer on which there is no floating gate; and
- a control gate layer formed on the, intergate dielectric layer;
- wherein the portion of the floating gate overlies about half of the fin.

11. A memory, array, comprising:
a substrate;
a plurality of isolation regions formed in the substrate and defining a plurality of active regions of the substrate, wherein an isolation region is formed between a pair of successive active regions;
a fin protruding from each active region;
a floating gate memory cell formed on each active region, the memory cell comprising;
- a tunnel dielectric layer formed on the active region, including the fin of that active region;
- a floating gate formed on a portion of the tunnel dielectric layer;
- an intergate dielectric layer formed on the floating gate and on a portion of the tunnel dielectric layer on which there is no floating gate; and
- a control gate layer formed on the intergate dielectric layer;
- wherein the portion of the floating gate extends beyond a location coinciding with an axis that bisects a width of the fin.

12. A memory array, comprising:
a plurality of rows of memory cells, each row comprising:
- a plurality of isolation regions formed in the substrate and defining a plurality of active regions of the substrate, wherein an isolation region is formed between a pair of successive active regions;
- a fin protruding from each active region;
- a floating gate memory cell formed on each active region and corresponding to the fin of that active region, the memory cell comprising:
  - a tunnel dielectric layer formed on the active region, including the fin of that active region;
  - a floating gate formed on a portion of the tunnel dielectric layer;
  - an intergate dielectric layer formed on the floating gate and on a portion of the tunnel dielectric layer on which there is no floating gate; and
  - a control gate layer formed on the intergate dielectric layer;
  - wherein the floating gate formed on the portion of the tunnel dielectric layer of the memory cells of every other row of memory cells faces a first direction; and
  - wherein the floating gate formed on the portion of the tunnel dielectric layer of the memory cells of intervening rows of memory cells faces a second direction opposite the first direction.

13. The memory array of claim 12, wherein the portion of each floating gate terminates at a location coinciding with an axis that bisects a width of a corresponding fin.

14. The memory array of claim 12, wherein the portion of each floating gate overlies about half of a corresponding fin.

15. The memory array of claim 12, wherein the portion of each floating gate extends beyond a location coinciding with an axis that bisects a width of a corresponding fin.

16. The memory array of claim 12, wherein the portion of each floating gate overlies more than half of a corresponding fin.

17. A memory device, comprising:
a memory array; and
control circuitry for controlling operations of the memory array;
wherein the memory array comprises:
- a plurality fins protruding from a substrate;
- a tunnel dielectric layer overlying the fins;
- a plurality floating gates overlying the tunnel dielectric layer so that each floating gate overlies a portion of a fin;
- an intergate dielectric layer overlying the floating gates; and
- a control gate layer overlying the intergate dielectric layer;
- wherein each fin comprises a rounded upper surface; and
- wherein each floating gate overlying a portion of a fin terminates at a location that overlies the rounded upper surface of that fin.

18. A memory device, comprising:
a memory array; and
control circuitry for controlling operations of the memory array;
wherein the memory array comprises:
- a plurality of isolation regions extending into a substrate;
- a plurality fins protruding from the substrate;
- a tunnel dielectric layer overlying the fins;
- a plurality floating gates overlying the tunnel dielectric layer, each of the plurality of floating gates comprising a fin protruding therefrom;
- an intergate dielectric layer overlying the floating gates; and
- a control gate layer overlying the intergate dielectric layer;

wherein an isolation region is located between successive fins protruding from the substrate.

19. A memory device, comprising:
a memory array; and
control circuitry for controlling operations of the memory array;
wherein the memory array comprises:
   a substrate;
   a plurality of isolation regions formed in the substrate and defining a plurality of active regions of the substrate, wherein an isolation region is formed between a pair of successive active regions;
   a fin protruding from each active region;
   a floating gate memory cell formed on each active region, the memory cell comprising:
      a tunnel dielectric layer formed on the active region, including the fin of that active region;
      a floating gate formed on a portion of the tunnel dielectric layer;
      an intergate dielectric layer formed on the floating gate and on a portion of the tunnel dielectric layer on which there is no floating gate; and
      a control gate layer formed on the intergate dielectric layer.

20. A memory device, comprising:
a memory array; and
control circuitry for controlling operations of the memory array;
wherein the memory array comprises:
   a plurality fins protruding from a substrate;
   a tunnel dielectric layer overlying the fins;
   a plurality floating gates overlying the tunnel dielectric layer;
   an intergate dielectric layer overlying the floating gates; and
   a control gate layer overlying the intergate dielectric layer;
   wherein each floating gate comprises a fin protruding therefrom, wherein the fin protruding from each floating gate is aligned with a fin protruding from the substrate that corresponds to that floating gate.

21. A memory device, comprising:
a memory array; and
control circuitry for controlling operations of the memory array;
wherein the memory array comprises:
   a plurality of rows of memory cells, each row comprising:
      a plurality of isolation regions formed in the substrate and defining a plurality of active regions of the substrate, wherein an isolation region is formed between a pair of successive active regions;
      a fin protruding from each active region;
      a floating gate memory cell formed on each active region and corresponding to the fin of that active region, the memory cell comprising:
         a tunnel dielectric layer formed on the active region, including the fin of that active region;
         a floating gate formed on a portion of the tunnel dielectric layer;
         an intergate dielectric layer formed on the floating gate and on a portion of the tunnel dielectric layer on which there is no floating gate; and
         a control gate layer formed on the intergate dielectric layer;
      wherein the floating gate formed on the portion of the tunnel dielectric layer of the memory cells of every other row of memory cells faces a first direction; and
      wherein the floating gate formed on the portion of the tunnel dielectric layer of the memory cells of intervening rows of memory cells faces a second direction opposite the first direction.

22. A memory module, comprising:
a plurality of contacts; and
two or more memory devices, each having access lines selectively coupled to the plurality of contacts;
wherein at least one of the memory devices comprises a memory array, comprising:
   a plurality of rows of memory cells, each row comprising:
      a plurality of isolation regions formed in the substrate and defining a plurality of active regions of the substrate, wherein an isolation region is formed between a pair of successive active regions;
      a fin protruding from each active region;
      a floating gate memory cell formed on each active region and corresponding to the fin of that active region, the memory cell comprising:
         a tunnel dielectric layer formed on the active region, including the fin of that active region;
         a floating gate formed on a portion of the tunnel dielectric layer;
         an intergate dielectric layer formed on the floating gate and on a portion of the tunnel dielectric layer on which there is no floating gate; and
         a control gate layer formed on the intergate dielectric layer;
      wherein the floating gate formed on the portion of the tunnel dielectric layer of the memory cells of every other row of memory cells faces a first direction; and
      wherein the floating gate formed on the portion of the tunnel dielectric layer of the memory cells of intervening rows of memory cells faces a second direction opposite the first direction.

\* \* \* \* \*

UNITED STATES PATENT AND TRADEMARK OFFICE
CERTIFICATE OF CORRECTION

PATENT NO. : 7,795,664 B2 Page 1 of 1
APPLICATION NO. : 12/257100
DATED : September 14, 2010
INVENTOR(S) : Seiichi Aritome It is certified that error appears in the above-identified patent and that said Letters Patent is hereby corrected as shown below:

In column 13, line 8, in Claim 9, delete "formed," and insert -- formed --, therefor.

In column 13, line 38, in Claim 10, delete "the," and insert -- the --, therefor.

In column 13, line 42, in Claim 11, delete "memory," and insert -- memory --, therefor.

In column 13, line 50, in Claim 11, delete "comprising;" and insert -- comprising: --, therefor.

Signed and Sealed this

Thirtieth Day of November, 2010

David J. Kappos
*Director of the United States Patent and Trademark Office*